(12) United States Patent
Kotta et al.

(10) Patent No.: US 11,360,573 B2
(45) Date of Patent: Jun. 14, 2022

(54) SELECTIVELY DISPLACED KEYS FOR INPUT AND OUTPUT

(71) Applicant: Intel Corporation, Santa Clara, CA (US)

(72) Inventors: Faizal A. Kotta, Bangalore (IN); Vishal Narayanan Potty, Bengaluru (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/990,885

(22) Filed: Aug. 11, 2020

(65) Prior Publication Data

US 2020/0371603 A1 Nov. 26, 2020

Related U.S. Application Data

(63) Continuation of application No. 16/024,135, filed on Jun. 29, 2018, now Pat. No. 10,754,439.

(51) Int. Cl.
*G06F 3/02* (2006.01)
*H01H 13/7065* (2006.01)
(Continued)

(52) U.S. Cl.
CPC ....... *G06F 3/0202* (2013.01); *H01H 13/7065* (2013.01); *H03K 17/972* (2013.01); *H01H 13/85* (2013.01); *H01H 2003/008* (2013.01); *H01H 2215/05* (2013.01); *H01H 2217/038* (2013.01); *H01H 2221/068* (2013.01); *H03K 2017/9706* (2013.01); *H03K 2017/9713* (2013.01)

(58) Field of Classification Search
CPC ........ G06F 3/0202; G06F 3/02; G06F 3/0231; G06F 2203/014; G06F 2203/015; H01H 13/7065; H01H 13/85; H01H 2221/068; H01H 2003/008; H01H 2217/038; H01H 2215/05; H03K 17/972; H03K 2017/9706; H03K 2017/9713
See application file for complete search history.

(56) References Cited

U.S. PATENT DOCUMENTS 4,054,944 A * 10/1977 Lau .......................... H01H 5/02
200/530
4,684,185 A 8/1987 Arney et al.
(Continued)

OTHER PUBLICATIONS

Savioz, Gregory, et al., "Towards Multi-finger Haptic Devices: A Computer Keyboard with Adjustable Force Feedback," 2011 International Conference on Electronic Machines and Systems, Aug. 20-23, 2011, Beijing China; 6 pages.

*Primary Examiner* — Mihir K Rayan
(74) *Attorney, Agent, or Firm* — Patent Capital Group

(57) ABSTRACT

In one aspect, an apparatus for receiving input and/or generating output comprises a key assembly. The key assembly comprises a key cover, a magnet, and an electromagnet. The magnet is coupled to the key cover. The electromagnet is operable to displace the key cover based on whether the key assembly is in an active state or an inactive state. In the active state, the electromagnet is operable to raise the key cover to a first position based on generation of a magnetic field. In the inactive state, the electromagnet is operable to lower the key cover to a second position based on cessation of the magnetic field.

20 Claims, 15 Drawing Sheets

(51) Int. Cl.
*H03K 17/972* (2006.01)
*H03K 17/97* (2006.01)
*H01H 13/85* (2006.01)
*H01H 3/00* (2006.01)

(56) References Cited

U.S. PATENT DOCUMENTS

| | | | | |
|---|---|---|---|---|
| 5,042,147 | A * | 8/1991 | Tashiro | H05K 3/0044 |
| | | | | 29/847 |
| 6,650,254 | B1 * | 11/2003 | Rix | G06F 3/0202 |
| | | | | 341/26 |
| 8,816,965 | B2 | 8/2014 | Causey et al. | |
| 9,401,713 | B2 * | 7/2016 | De Saulles | G06F 1/1666 |
| 10,754,439 | B2 * | 8/2020 | Kotta | H01H 13/7065 |
| 2006/0132446 | A1 * | 6/2006 | Soh | G06F 3/0202 |
| | | | | 345/168 |
| 2007/0142077 | A1 * | 6/2007 | Huang | A63F 13/323 |
| | | | | 455/550.1 |
| 2008/0297475 | A1 * | 12/2008 | Woolf | G06F 3/0233 |
| | | | | 345/163 |
| 2010/0025212 | A1 * | 2/2010 | Xu | H04M 19/04 |
| | | | | 200/341 |
| 2013/0233685 | A1 | 9/2013 | Zhang | |
| 2016/0042897 | A1 * | 2/2016 | Qian | H01H 13/85 |
| | | | | 335/207 |

* cited by examiner

SELECTIVELY DISPLACED KEYS FOR INPUT AND OUTPUT

CROSS-REFERENCE TO RELATED APPLICATION

This Application is a continuation (and claims the benefit of priority under 35 U.S.C. § 120) of U.S. application Ser. No. 16/024,135, filed Jun. 29, 2018, entitled "SELECTIVELY DISPLACED KEYS FOR INPUT AND OUTPUT," which is hereby incorporated by reference in its entirety.

TECHNICAL FIELD

Embodiments described generally relate to the field of user input and output devices and, in particular, to user input and output devices having keys that are differentially displaced for input and output.

BACKGROUND

In computing systems, input devices are used to transmit an input from a user to a processor. These input devices translate inputs, such as movements, button presses, and other physical action, into data for processing by the processor. An input device can include, for example, a keyboard, a mouse, a joystick, a game controller, and the like. In addition, output devices are used to transmit data from a processor to a user. These output devices translate data into a human-perceivable form for the user. The data may be translated to text, a graphical representation, an audio representation, and/or a tactile feedback. An output device can include, for example, a screen, a speaker, a haptic device, and the like.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EMBODIMENTS

Figure 1:
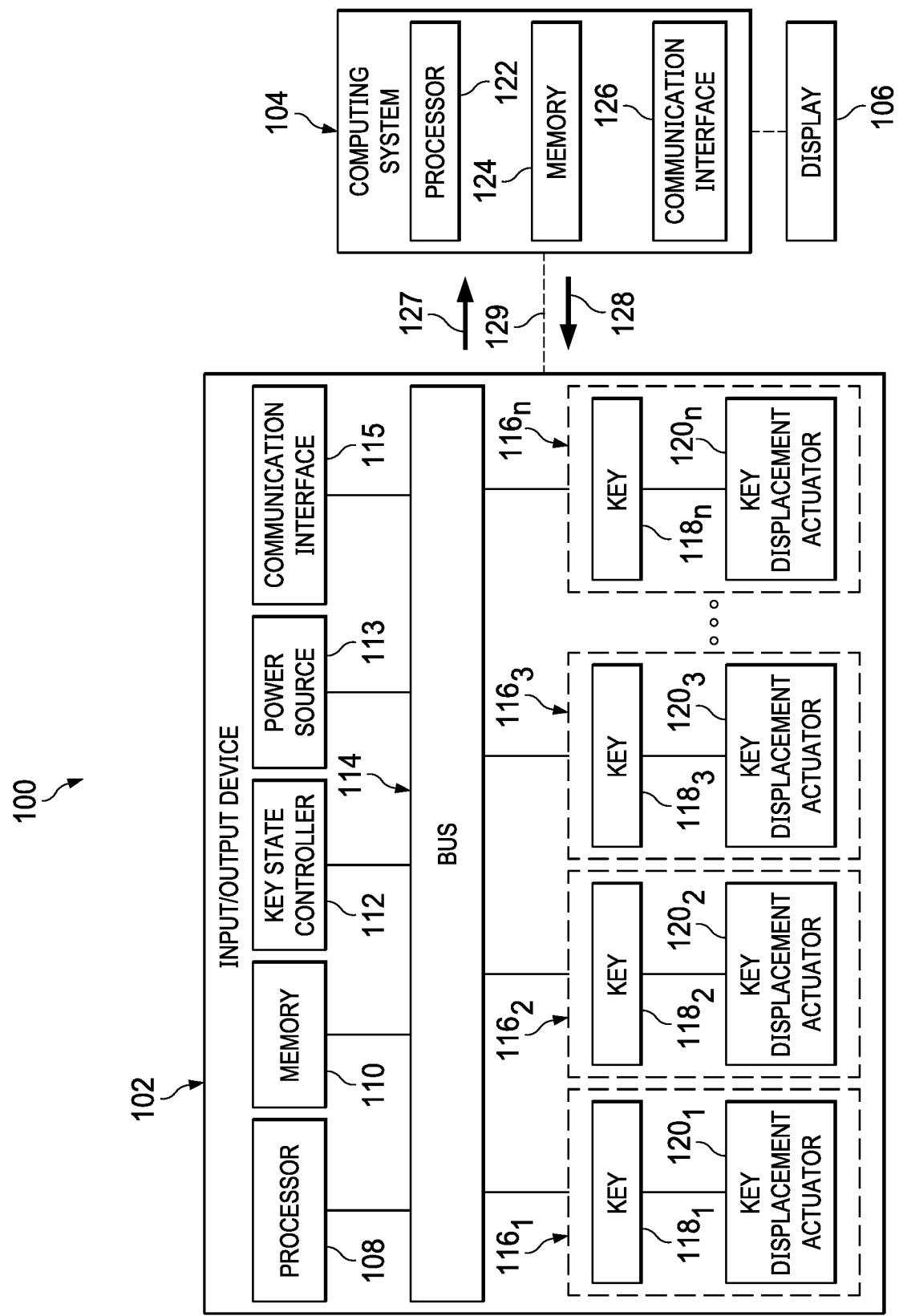
FIG. 1 is a simplified diagram of a system 100 for transferring data between devices.

A keyboard is an important input device in many modern computing systems. In general, a keyboard may be a physical keyboard or a virtual keyboard. A "physical keyboard" includes physical keys (or physical buttons) for receiving input from a user. Each of the physical keys are electrically and/or mechanically coupled to a computing system for converting the physical interaction to a signal from transmission to the computing system. A "virtual keyboard" includes a graphical representation of keys (virtual keys) that are rendered, for example, on a display screen. Virtual keys are linked to a computing system by software and/or firmware and not by corresponding electrical and/or mechanical couplings. As an example, a physical keyboard relies on a user's interactions with a physical key such as applying a force to depress the physical key and create a keystroke. A virtual keyboard relies on virtual interactions such as a touch on a touchscreen with the virtual keys, which are unable to be physically depressed.

Receiving input is a primary function of a keyboard however, some existing keyboards include only minimal output capability. For example, keyboards include output elements such as lights to indicate a state of the keyboard. Such a light may indicate whether a keyboard is on or off and/or whether a function, such as caps lock, is activated. In other examples, keyboards utilize lights under the keys to create a backlight effect. Each of these outputs systems require that a user look at the keyboard to discern the output.

Some existing keyboards generate output that requires a user to take their visual attention away from a user interface on a display to which the keyboard may be coupled. This disrupts the user's attention to the user interface. As an example, it can be challenging for a user to use a keyboard as an input device when playing a computer-based game. Some games store an association between gaming actions and a limited subset of the keys on the keyboard. For example, the game may associate a set of gaming keys such as several keys on a QWERTY keyboard with gaming actions such as "run," "jump," "shoot," and "duck down." The remaining keys on the QWERTY keyboard are non-gaming keys, which are not associated with gaming actions (or are associated with non-action). When any of the gaming keys on the keyboard is pressed, the corresponding gaming action is executing in the game. In contrast, when any of the non-gaming keys on the keyboard is pressed, no gaming action is executed in the game. While the keyboard receives input from the non-gaming keys, the lack of an associated with a gaming action results in the game ignoring the input from the non-gaming keys. The non-gaming keys provide no control over the game though they can be pressed by the user.

A challenge associated with the use of keyboards and other input and output (I/O) devices is that users can confuse active keys and inactive keys and/or may confuse some of the active keys with one another. In the gaming example above, a user may focus on a display and not on the keyboard and, as a result, may confuse the gaming keys with non-gaming keys and/or confuse one gaming key with another gaming key. This confusion can cause the user to provide erroneous keystrokes that are ignored and/or are ineffective to control the game. There is a need for an approach to provide output from an I/O device that distinguishes between active keys and inactive keys and does not require visual focus on the I/O device.

A possible solution is to use tactile feedback via the I/O device. For example, some existing keyboards provide a mechanical resistance to the user during a keystroke based on a spring mechanism (e.g., to create a "click" effect). This mechanical resistance is constant and is the same of all keys on the keyboard. Once this resistance is overcome (i.e., the key is depressed), there is no further tactile feedback. When the key is released, the spring mechanism returns the keys to an upright position. Some existing keyboards can select an amount of stiffness of all the keys (e.g., to create a softer or harder "click" effect). Some I/O devices such as gaming controllers (or joysticks) include a vibratory element that vibrates to provide output to the user. Such vibratory elements collectively vibrate the entire controller and all the keys on the controller. Such approaches do not distinguish between active keys and inactive keys.

A solution disclosed herein selectively displaces physical keys of an I/O device. The keys are physically differentiated from one another and/or emphasized based on the displacement. Each of the keys can be raised or lowered based on whether they are active or inactive, which changes the physical position of the keys. The displacement can vary between individual keys on a single I/O device. As a non-limiting example, an active key on an I/O device may be raised while an inactive key on the I/O device is lowered such that the active key stands above the inactive key. This vertical displacement of the active key above the inactive key enables a user to distinguish the active and inactive keys based only on touch. The user need not look at the keys to discern which is active versus inactive. Instead, the user's fingers can feel the elevated keys. This, for example, enables the user to perceive which keys are active keys and which keys are inactive keys without taking their eyes off a display screen. The displacement of a key can be varied over time to generate a tactile output such as a vibration. An intensity and/or frequency of the tactile output can vary on a key-by-key basis. For example, each key can be displaced and/or vibrated independently of other keys on the same I/O device. Tactile output from an active key and the lack of a tactile output from an inactive key enables a user to distinguish the active and inactive keys based only on touch. Moreover, the tactile output can transmit feedback. For example, the feedback can be application specific (e.g., can vary based on which of one or more executable applications is executing on a computing device). The user need not look at the keys to perceive the feedback. The selectively displacement and/or tactile output of the keys can distinguish active keys from inactive keys and transmit feedback without requiring the users take their visual focus away from a user interface on a display to which the I/O device is be coupled. This enables the user to maintain their visual attention on the user interface. The physical layout of the I/O device changes to reflect a state of each key and/or to generate feedback from each key.

An input and output (I/O) device of the present disclosure can include a set of keys. The I/O device can activate or deactivate a key and move the key to different positions based on the activation state of the key (e.g., active state, inactive state, and the like). For example, the I/O device can include a key assembly. The key assembly includes a key cover, a magnet coupled to the key cover, an electromagnet, and a base supporting the electromagnet. The electromagnet displaces the key cover based on whether the key assembly is in an active state or an inactive state. In the active state, the electromagnet raises the key cover to a first position based on generation of the magnetic field. The electromagnet is operable to generate a magnetic field, which can cause the magnet and the attached key cover to levitate over the electromagnet. In the inactive state, the electromagnet lowers the key cover to a second position based on cessation of the magnetic field. When the electromagnet ceases to produce the magnetic field, the key cover can lower based on gravity acting on the weight of the magnet and the key cover. In some examples, the key assembly lacks a spring to support the key cover. Instead of a spring, the magnet and electromagnet support the key cover.

The systems, methods, apparatuses, and devices of the present disclosure can be applied to any action involving generating inputs or outputs associated with a computing system. Embodiments of the present disclosure may be integrated into I/O devices such as keyboards (e.g., stand-alone keyboards, a keyboard on a laptop/desktop computer, on a gaming device, on a mobile device, on an automobile), controller devices, gaming controllers, joysticks, and the like. Embodiments of the present disclosure can create a new user experience in which keys gradually raise during start-up of a device and/or the keys gradually lower during shout-down of the device. Embodiments of the present disclosure can help people with visual impairments. For example, keys of the present disclosure can generate haptic feedback so that a blind and/or visually impaired person can easily identify a key. Embodiments of the present disclosure can improve a gaming experience by elevating active keys, such as gaming keys, are above inactive keys to reduce the likelihood of a user pressing a wrong key. Each gamer can customize which keys are active for game play. While playing the game, the keys can vibrate (or generate other haptic feedback) based on a feedback signal from the game. The keys can vibrate depending on the game scenario such as varying, in near real-time, a type and/or intensity of vibration based on a weapon being used (e.g., vibrate at a higher frequency when using an automatic weapon and vibrate at a lower frequency when using a semi-automatic weapon). Embodiments of the present disclosure can be used to restrict inputs from keys. For example, some applications only accept certain keyboard inputs such as only numbers (and not letters) or only the letters such as "Y" or "N" based on a "Yes" or "No" prompt. Embodiments of the present disclosure can raise keys that are valid inputs and/or lower keys that are invalid inputs to prevent selection of invalid keys. Such embodiments disable invalid keys, enable invalid keys, and/or generate vibrations to identify either valid or invalid keys. Embodiments of the present disclosure can be used to raise, or lower keys based on a prediction of which inputs are likely to be next based on previous inputs (e.g., predictive typing, automatic completing of words). For example, if a user typed the following letter sequence: "elephan", the I/O device may lower and deactivate all keys except for a key corresponding to the letter "t" based on a prediction that the user is typing the word "elephant." The displacement of each key can be controlled based on one or more factors including settings by a user (e.g., user preferences, programmed based on inputs received from an application programming interface (API) associated with the I/O device), an application (e.g., settings associated with and/or set by an executable program for which keys are active and/or inactive and/or which keys generate feedback).

Many other examples and applications are within the scope of the present disclosure some of which are described with respect to the Figures.

The present disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for simplicity and clarity only and does not, in itself, dictate a relationship between the various embodiments and/or configurations discussed.

FIG. 1 is a simplified diagram of a system 100 for transferring data between devices. The system 100 includes an input and output (I/O) device 102 and a computing system 104 operably coupled to one another by a connection 129. The I/O device 102 includes a processor 108, a memory 110, a key state controller 112, a power source 113, a communication interface 115, a plurality of key assemblies $116_1$-$116_n$, and a bus 114 coupling the other components to one another. The bus 114 includes a circuit that couples the components to one another for transmission of power and/or electrical signals. Each of the plurality of key assemblies $116_1$-$116_n$ includes a key $118_1$-$118_n$ (such as key covers) and a key displacement actuator $120_1$-$120_n$, respectively. Each of the plurality of key assemblies is operable to receive input via keystrokes on its key. In addition, each of the plurality of key assemblies is operable to displace the key and/or generate a tactile output via the key based by activating the key displacement actuator. Each key assembly can perform operations such as vibrating, raising, lowering, other otherwise generating tactile output based on signals received from the computing system 104. Each of the key assemblies $116_1$-$116_n$ can be displaced independently of one another based, at least in part, on each of the key assemblies $116_1$-$116_n$ including its own dedicated key displacement actuator $120_1$-$120_n$. The computing system 104 comprises a processor 122, a memory 124, and a communication interface 126. The computing system 104 is operably coupled to a display 106. The display 106 is operable to generate human-readable display information. The display can include an audiovisual (A/V) output system such as a screen, a television, a monitor, and the like.

The computing system 104 may include any type of device. The computing system 104 may be any device operable to establish a communication session with another device, such as a computer (e.g., a laptop computer, a desktop computer, and the like), a personal digital assistant (PDA), a cellular telephone, a smartphone, a tablet, a gaming system (e.g., a hand-held gaming system, a set-top gaming system, a gaming console, and/or any computational device capable of rendering a gaming interface and receiving input from a user to interact with the game), a set-top box, or any other device, component, element, network element, or object capable of initiating data exchanges within a communication network.

The I/O device 102 is operable to receive input from the plurality of key assemblies $116_1$-$116_n$. As an example, the input can include keystroke data corresponding to the ones of the keys 118 that are pressed by a user. The I/O device 102 can convert the input to a data form for transmission to the computing system 104 such as a data encoding protocol and/or a data structure. The I/O device 102 transmits to the computing system 104 data 127 corresponding to the input. In addition, the I/O device 102 may generate a tactile output via the plurality of key assemblies $116_1$-$116_n$ based on data 128 received from the computing system 104. The tactile output can be executed by activating one or more of the key displacement actuators $120_1$-$120_n$.

The connection 129 is configured to carry signals such as between the I/O device 102 and the computing system 104. For example, the connection 604 carries data 127 transmitted from the I/O device 102 to the computing system 104. The connection 604 also carries data 128 transmitted from the computing system 104 to the I/O device 102. The connection 604 can comprise a wired connection (e.g., established on one or more wires), a wireless connection (e.g., established on one or more radios), or both a wired and a wireless connection. The wired connection may utilize cables, plug/receptacle connectors (e.g., Universal Serial Bus), or any other physical connection for data transmission established on one or more wires. The wireless connection may utilize wireless data transmission protocols (e.g., WI-FI protocol, BLUETOOTH protocol, a near-field communication (NFC) protocol, and the like) (e.g., established on one or more radios). The connection 604 can be direct or an indirect connection between the I/O device 102 and the computing system 104. In a direct connection between the computing system 104 (i.e., no intermediate device). When direct, the connection 604 excludes any intermediate device between the I/O device 102 and the computing system 104. A BLUETOOTH connection established directly between the I/O device 102 and the computing system 104 is an example of a direct connection. When indirect, the connection 604 includes intermediate device between the I/O device 102 and the computing system 104. A network connection (e.g., established over the Internet) between the I/O device 102 and the computing system 104 is an indirect connection at least because it utilizes various intermediate device (e.g., a server, a router, and the like) to facilitate the connection.

The processor 108 and/or the processor 122 may be any type of processor, such as a microprocessor, an embedded processor, a digital signal processor (DSP), a network processor, a multi-core processor, a single core processor, or other device to execute code. The processor 108 and/or the processor 122 may be a single-threaded or multithreaded in that it may include more than one hardware thread context (or "logical processor"). The processors 108 and/or 122 are configured to execute instruction code in a manner disclosed herein. Though depicted as a single block for clarity in FIG. 1, each of the processors 108 and 122 may comprise multiple (one or more) processing elements. In addition, the processors 108 and 122 may be combined into a single processing element, which may be located in the I/O device 102, the computing system 104, or another network element.

Each of the memory 110 and the memory 124 is configured to store data used for the operations described herein. This includes the memory 110 and/or the memory 124 being able to store software, logic, code, or processor instructions that are executed to carry out the activities described in this Specification. Though each of the memory 110 and the memory 124 is depicted as a single block for clarity in FIG. 1, each may comprise multiple memory elements. For example, each of the memory 110 and the memory 124 may comprise any of a hard disk drive (HDD), a solid-state drive (SSD), random access memory (RAM), a remote storage device (e.g., cloud storage service, online file storage), other memory elements (or combinations thereof). To achieve low latency, some data may be stored in main memory (e.g., HDD or SRAM) while other data is stored in RAM (where fast access is needed to achieve/maintain low latency). The processors 108 and/or 122 can execute any type of instructions associated with the data stored on the memory 110 and/or the memory 124 to achieve the operations detailed herein in this Specification.

Each of the communication interfaces 115 and 126 is operable to transmit and receive data. The communication interfaces 115 and 126 may communicate with one another and/or with other devices. For example, the communication interface 115 is operable to couple the I/O device 102 to the computing system 104 via the communication interface 126. Each of the communication interfaces 115 and 126 may implement compatible communication protocol to enable communication between the I/O device 102 and the computing system 104. The communication path between the communication interfaces 115 and 126 may be: wired, wireless, and/or a combination of wired and wireless. In the case of wireless data transmission, the communication interfaces 115 and 126 are configured to wirelessly transmit and wirelessly receive packets that comply with a wireless communication protocol. The communication interfaces may support various communications and/or security protocols including, but are not limited to, Internet Protocol (IP), Hypertext Transfer Protocol (HTTP), Secure Sockets Layer (SSL), Simple Object Access Protocol (SOAP)), BLUETOOTH, WI-FI (e.g., the Institute of Electrical and Electronics Engineers (IEEE) 802.11 such as IEEE std 802.11-2016), WIGIG (e.g., IEEE 802.11ad-2012, published December 2013), and the like. In some embodiments, a wireless communication interface is a transceiver or a transmitter-receiver. As an example, the receiving module of the wireless communication interface may comprise a radio receiver configured to receive electromagnetic waves in a radio frequency (e.g., packets encoded in a wireless communication protocol therein); a transmitting module of the wireless communication interface may comprise a radio transmitter configured to transmit electromagnetic waves in a radio frequency (e.g., packets encoded in a wireless communication protocol therein). Data received over by the communication interfaces 115 and 126 may be stored in a memory element (e.g., memory 110 and/or 124) for processing by a processor (e.g., processor 108 and/or 122). The communication interfaces 115 and 126 the received data from the communication protocol to a data encoding protocol for storage in the memory.

The power source 113 is operable to supply electrical power to the I/O device 102. The power source 113 may supply direct current (DC) and/or alternating current (AC). The power source 113 may include a mobile power supply and/or a connection to a power grid. A mobile power supply may include, for example, a battery, solar cell, or fuel cell. In some embodiments, the power source 113 is located in the I/O device 102. In other embodiments, the power source 113 is located in the computing system 104 and is transmitted from the computing system 104 to the I/O device 102. In still other embodiments, the power source 113 is external to the computing system 104 and the I/O device 102. Each of the key assemblies can be enabled and/or disabled independently from one another while the I/O device 102 is actively receiving power from the power source 113.

The key state controller 112 is operable to control an activation state of the key assemblies. The key state controller 112 can include any type of processor, such as a microprocessor, an embedded processor, a digital signal processor (DSP), a network processor, a multi-core processor, a single core processor, or other device to execute code for control of the keys. The key state controller 112 may set the activation state based on data received from the computing system 104. The activation state can include an active state, an inactive state, and/or additional key states. The activation state may be stored in and/or retrieved from a memory. For example, the key state controller 112 read from and/or write to a memory location (such as a register) storing a value representing the activation state of each of the key assemblies. The key state controller 112 may transmit a signal to a processor based on a state of each key assembly (e.g., activation state and/or whether pressed or not pressed). Advantageously, each of the plurality of key assemblies $116_1$-$116_n$, is operable to effectuate a physical change based on the activation state. For example, the plurality of key assemblies $116_1$-$116_n$, can retrieve the activation state from the memory location and activate the key displacement actuator based on the activation state. In some embodiments, the key state controller 112 may activate the key displacement actuator based on the activation state.

Each of the plurality of key assemblies 116 (i.e., the key assemblies $116_1$-$116_n$) includes a corresponding key 118 (i.e., the keys $118_1$-$118_n$, respectively) such as a key cover and a corresponding key displacement actuator 120 (i.e., the key displacement actuators $120_1$-$120_n$, respectively). Within each of the key assemblies 116, the key 118 is coupled to a key displacement actuator 120. Each key 118 is operable to receive input.

The I/O device 102 of FIG. 1 is illustrated having a certain number (n) of key assemblies. Embodiments of the present disclosure are not limited to any particular number of key assemblies. Different embodiments may include different numbers of key assemblies. For example, FIG. 2 shows an I/O device having 114 key assemblies.

FIG. 1 illustrates several components that can facilitate embodiments of the present disclosure of the present disclosure actively displacing keys based on corresponding activation states of the keys. Many of the components are not illustrated in other figures (e.g., the remaining FIGS. 2-16) only for simplicity of the figures. Embodiments of the present disclosure include a plurality of components to make it operable to displace keys as disclosed herein. Thus, some examples of each of the devices and/or key assemblies in other Figures of the present disclosure can include and/or utilize such components though the components are not illustrated in the other Figures only for the sake of simplicity.

Figure 2:
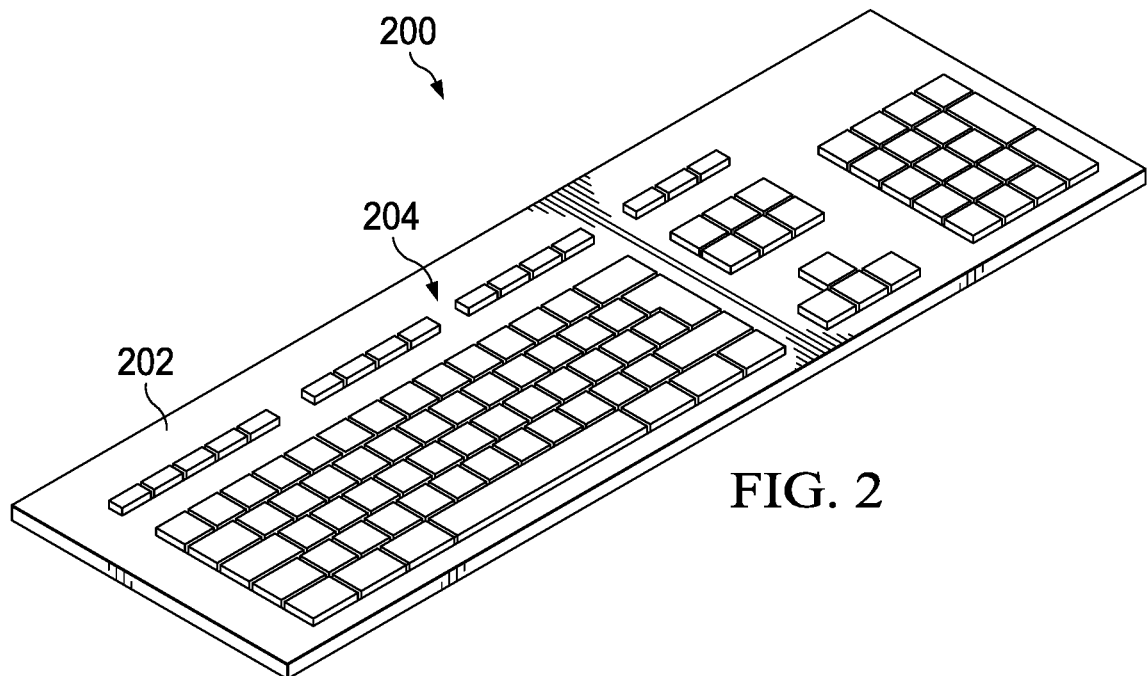
FIG. 2 illustrates a keyboard device 200, according to some embodiments of the present disclosure.

FIG. 2 illustrates a keyboard device 200, according to some embodiments of the present disclosure. The keyboard device 200 is an example of the I/O device 102 of FIG. 1. The keyboard device 200 is a physical keyboard. The keyboard device 200 comprises a housing 202 and a set of key assemblies, which includes a corresponding set of key covers 204. The housing 202 supports and protects internal components as well as the key covers. Each of the key covers 204 is operable to generate an input signal based on receiving a keystroke. A keystroke is inclusive of a vertical displacement of the key cover caused by a force applied to the key cover (e.g., by a user). The input signal may be a data structure corresponding to an alphanumeric character, a function call for control of a corresponding computing system (e.g., to power-up or power-down the computing system, change display characteristics for a screen coupled to the computing system, activate a CAPS-LOCK function, and the like), a directional input (e.g., up, down, left, right), and/or other inputs that are customized based on an application-specific setting. Each of the key covers 204 comprises human-readable indicia identifying the key. The human-readable indicia can include text such as numbers, letters, shapes, punctuation, or other symbols. Such indicia can be, for example, printed on, embossed in, raised from a surface of the key cover. Advantageously, each of the key covers 204 can be selectively displaced (e.g., by an actuator) to provide a tactile output from the keyboard device 200. Such displacement of the key covers can physically differentiate some of the key covers from others of the key covers, can reduce the likelihood of a user pressing a wrong key covers, and/or can prevent keystrokes on the wrong key covers from being effectively received by a corresponding key assembly.

Figure 3:
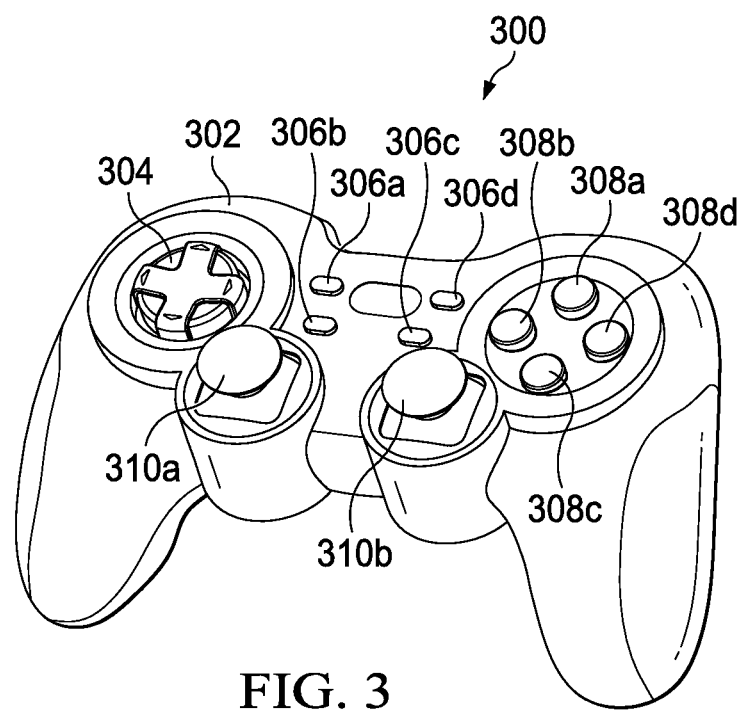
FIG. 3 illustrates a controller device 300, according to some embodiments of the present disclosure.

FIG. 3 illustrates a controller device 300, according to some embodiments of the present disclosure. The controller device is an example of the I/O device 102 of FIG. 1. The controller device 300 comprises a housing 302 and key assemblies, which include corresponding key covers 304, 306a-d, 308a-d, 310a and 310b. The housing 302 supports and protects internal components as well as the key covers. Each of the key covers 304, 310a, and 310b correspond to directional keys assemblies for which the key covers that can be tilted to provide a directional input. The directional input can include, e.g., up, down, left, right, angles (e.g., ranging from 0 to 360 degrees) and/or combinations thereof. Each of the key covers 306a-d and 308a-d is operable to generate an input signal based on receiving a keystroke. In some examples, the key assemblies of the controller device 300 are programmed to control inputs for a game executing on a computing system. Advantageously, each of the key covers 304, 306a-d, 308a-d, 310a and 310b can be selectively displaced (e.g., by an actuator) to provide output from the controller device 300. Such displacement of the key covers can physically differentiate some of the key covers from others of the key covers, can reduce the likelihood of a user pressing a wrong key covers and/or can prevent keystrokes and/or directional forces on the wrong key covers from being effectively received by a corresponding key assembly.

FIGS. 4A, 4B, 5A, 5B, 6A, 6B, 7A, and 7B illustrate a key assembly 400, according to some embodiments of the present disclosure. The key assembly 400 is an example of a key assembly 116. In some embodiments, each of the key assemblies of the keyboard device 200 (FIG. 2) is an instance of the key assembly 400. In some embodiments, each of the key assemblies of the controller device 300 is an instance of the key assembly 400.

Figure 4A:
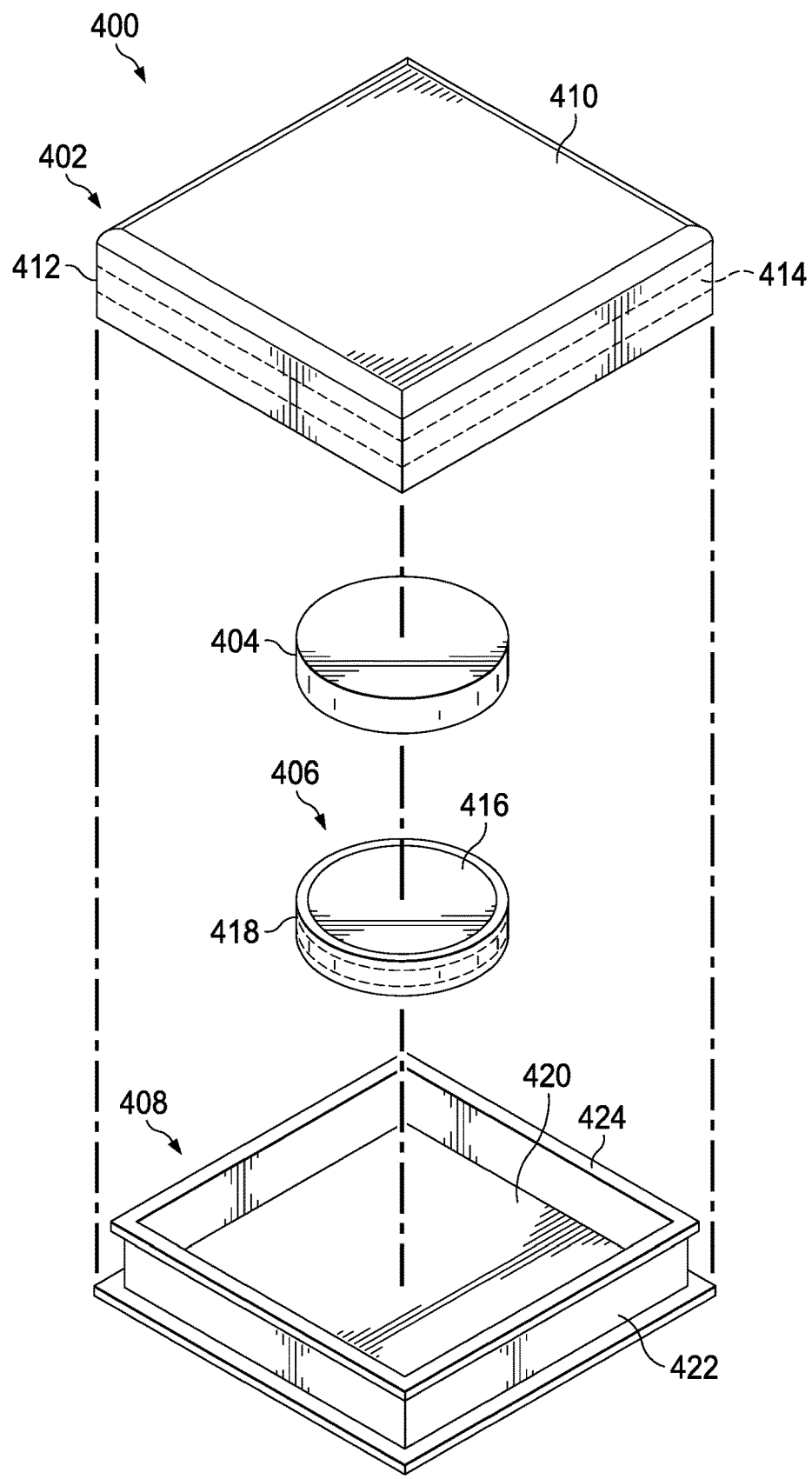
FIGS. 4A and 4B illustrate a key assembly 400, according to some embodiments of the present disclosure.
Figure 4B:
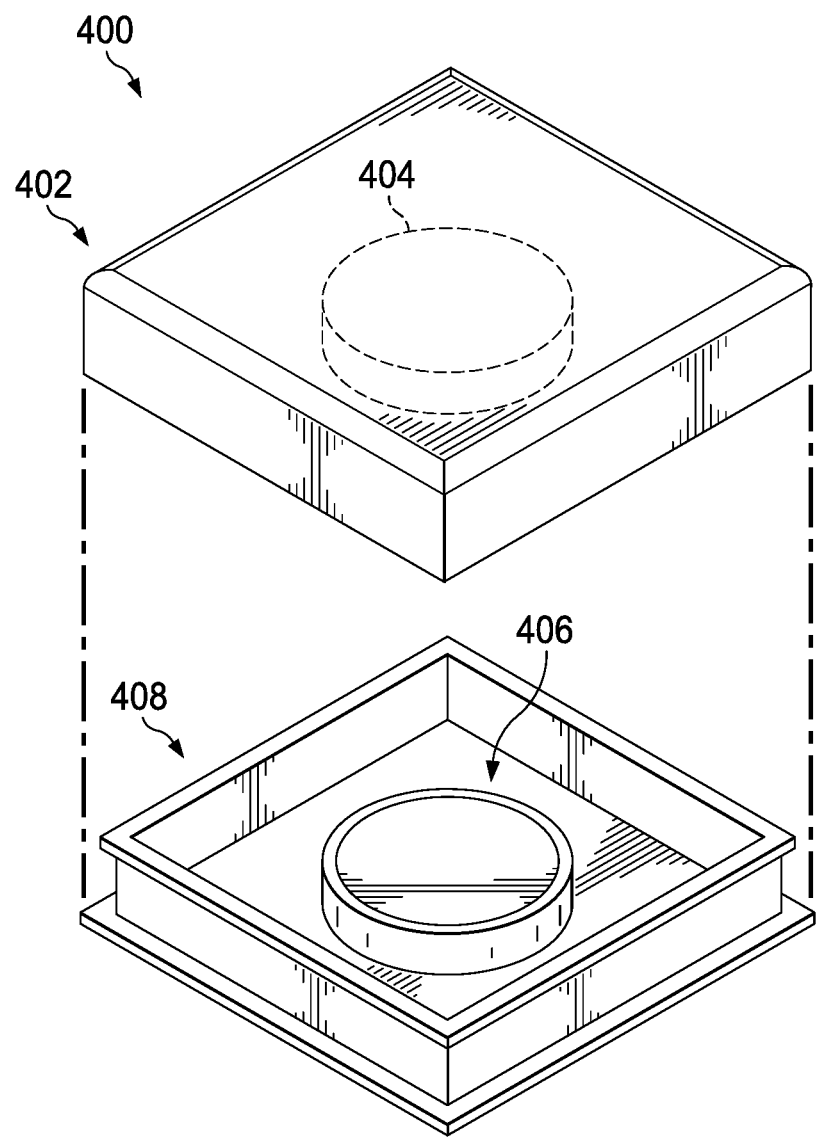

The FIG. 4A is an exploded view of the key assembly 400. The key assembly 400 includes a key cover 402, a magnet 404, an electromagnet 406, and a base 408. The key cover 402 comprises a wall 410 and a sidewall 412. In some examples, an outer surface of the wall 410 includes human-readable indicia identifying a key. The sidewall 412 comprises a recession 414. The magnet 404 can be coupled to the key cover 402. The key cover 402 is an example of a key 118 of the I/O device 102 of FIG. 1. The magnet 404 can include a permanent magnet. The electromagnet 406 comprises a core 416 and a coil 418. The core 416 comprises at least one metal. The coil 418 wraps, at least in part, around the core 416. The electromagnet 406 is operable to receive a current from a power source via a circuit and to generate a magnetic field based on transmitting a current through the coil 418 and around the core 416. The magnetic field exerts a force on the magnet 404 which can displace the magnet 404 and the key cover 402. The force applied by the magnetic field is proportional to the current. Together, the magnet 404 and the electromagnet 406 are an example of a key displacement actuator 120 of the I/O device 102 of FIG. 1. The base 408 comprises a wall 420 and a sidewall 422. The sidewall 422 comprises a lip 424. The sidewalls 412 and 422 can limit lateral displacement of the key cover 402 with respect to the base 408 and/or electromagnet 406. The lip 424 and the recession can limit vertical displacement of the key cover 402 with respect to the base 408 and/or electromagnet 406. The base 408 is operable support components of the key assembly 400. The FIG. 4B is a view of the key assembly 400, when partially assembled, in which the magnet 404 is coupled to an inner surface of the wall 410 and the electromagnet 406 is coupled to an inner surface of the wall 420. A user may apply a force to the key cover 402 and, thereby, cause the key cover 402 to be depressed (e.g., a keystroke). The key assembly 400 is operable to receive an input (e.g., for transmission to a computing system) based on the the keystroke. The key assembly 400 receives the input based on a detecting that the key cover 402 is physical depressed while in an active state. The key assembly 400 can transmit the input to a processor.

FIGS. 5A, 5B, 6A, 6B, 7A, and 7B illustrate various view of the key assembly 400, when fully assembled, in which the key cover 402 and the base 408 are engaged with another. The sidewall 412 of the key cover 402 wraps the sidewall 422 of the base 408, which can prevent and/or limit an amount of lateral displacement of the key cover 402. The lip 424 nests within the recession 414, which can limit an amount vertical displacement of the key cover 402. The electromagnet 406 is operable to vertically levitate the key cover 402 using a magnetic field based on whether the key assembly is in an active state or an inactive state. As the key cover 402 moves during levitation, the lip 424 slides within the recession 414 and can prevent the key cover 402 key from levitating too high (e.g., higher than the sidewall 422 on the base 408). In the active state, the electromagnet 406 raises the key cover 402 to a first position based on generation of the magnetic field. The electromagnet 406 generates the magnetic field, which causes the magnet and the attached key cover to levitate over the electromagnet 406. As an example, the magnetic field may be stopped based on detecting that the key assembly 400 is in an inactive state. In the inactive state, the electromagnet 406 lowers the key cover to a second position based on cessation of the magnetic field. When the electromagnet is not producing the magnetic field, the key cover can lower based on gravity acting on the weight of the magnet and the key cover.

Figure 5A:
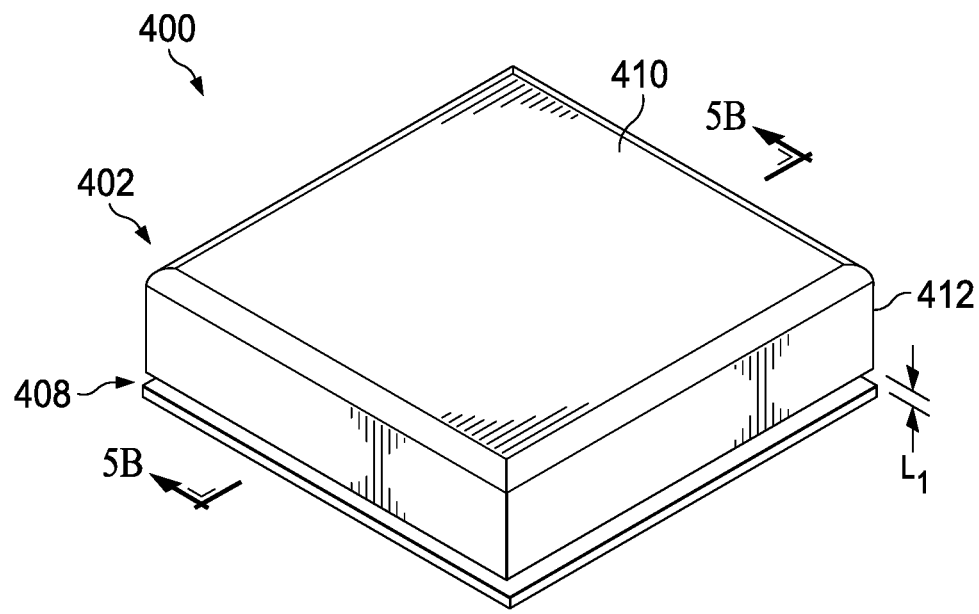
FIGS. 5A, 5B, 6A, 6B, 7A, and 7B illustrate some operations of the key assembly 400, according to some embodiments of the present disclosure.
Figure 5B:
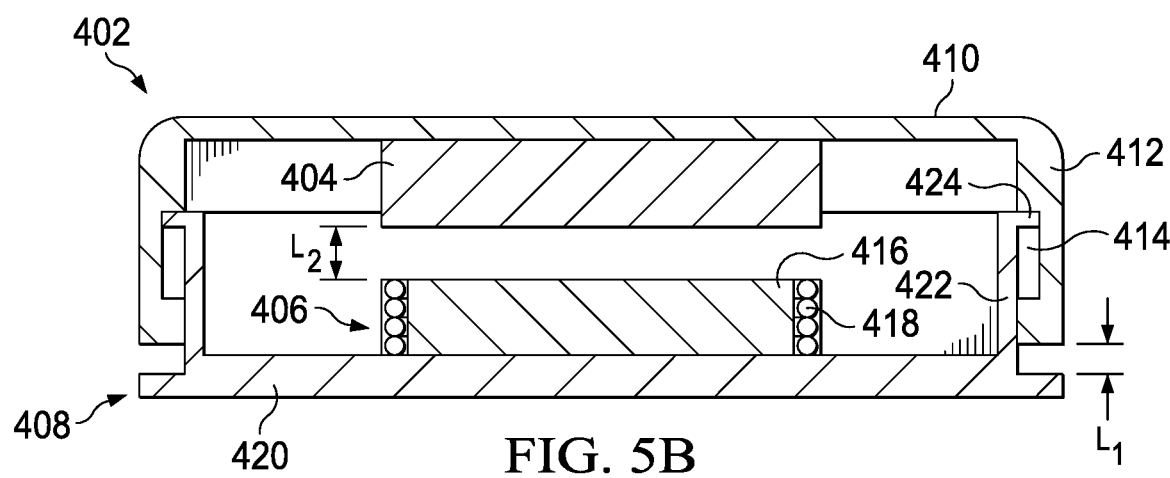

FIG. 5A is a view of the key assembly 400 in a lowered position based on being in an inactive state. FIG. 5B is a cross-section of the key assembly 400 of the FIG. 5A as generally indicated by section lines labeled "5B" in FIG. 5A. The electromagnet 406 is not generating a magnetic field and, consequently, the key cover 402 has lowered to rest on the base 408. As previously discussed, the key assembly 400 receives an input based on a detecting that the key cover 402 is physical depressed while in an active state. By lowering the key cover 402, the key assembly 400 prevents any keystrokes at the key cover 402 from being effective for generating the input because the key cover 402 cannot be further depressed. Thus, the key assembly 400 is not operable to receive the input via the key cover 402 when at the lowered position. In addition, the key assembly 400 enables a user of the key assembly to identify that the key assembly is in an inactive state based on the physical location of the key cover, which in the case is in the lowered position. In the lowered position, the base 408 and the key cover 402 are separated by a distance $L_1$; the magnet 404 and the electromagnet 406 are separated by a distance $L_2$.

Figure 8A:
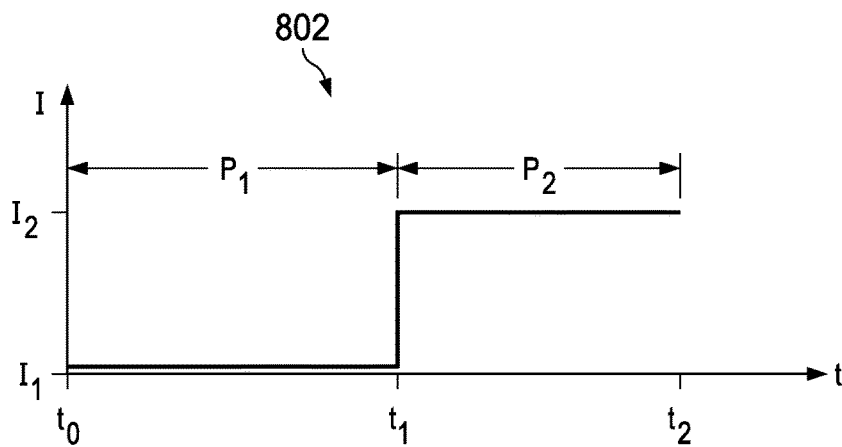
FIG. 8A illustrates a graph of current varying over time, according to some embodiments of the present disclosure.
Figure 8B:
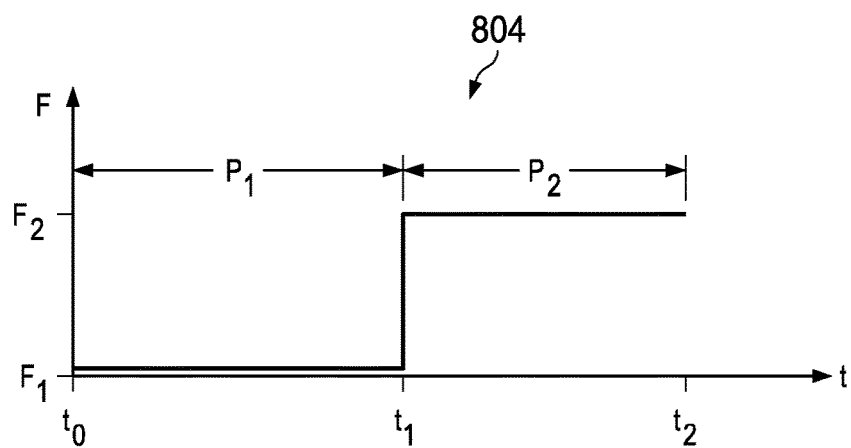
FIG. 8B illustrates a graph of force varying over time, according to some embodiments of the present disclosure.
Figure 8C:
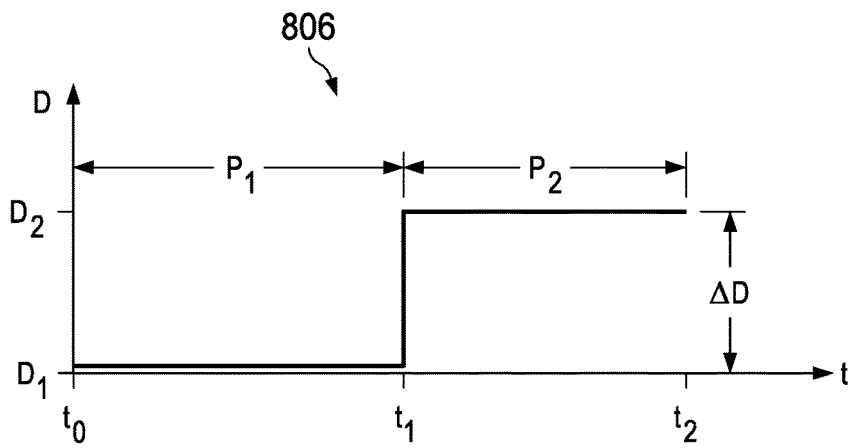
FIG. 8C illustrates a graph of an amount of displacement varying over time, according to some embodiments of the present disclosure.

The electromagnet 406 is operable to receive a current from a power source via a circuit and to generate a magnetic field based on transmitting a current through the coil 418 and around the core 416. The magnetic field exerts a force on the magnet 404 proportional to the current. The force causes the magnet 404 and the key cover 402 to displace with respect to the electromagnet. The displacement is proportional to the force. As an example, FIG. 8A illustrates a graph 802 of current (I) varying over time (t); FIG. 8B illustrates a graph 804 of force (F) varying over time (t); and FIG. 8C illustrates a graph 806 of an amount of displacement (D) varying over time (t). The force graph 804 corresponds to the current graph 802. The force in the graph 804 is exerted on the magnet 404 based on the magnetic field generated by the electromagnet 406 based on the current in the graph 802. The displacement graph 806 corresponds to the force graph 804. The displacement in the graph 806 is experienced by the magnet 404 based on the based on the force in the graph 804. At time t0, the is at a first current $I_1$. As a result, the corresponding force and displacement are $F_1$ and $D_1$, respectively. The current, force, and displacement remain constant for a period of time $P_1$. At time $t_1$, the current increases to a second current $I_2$. As a result, the corresponding force and displacement increase to $F_2$ and $D_2$ respectively. Thus, the key displaces by a distance AD (i.e., $D_2$-$D_1$). The current, force, and displacement remain constant for a period of time $P_2$. (e.g., at least through time t2).

Figure 6A:
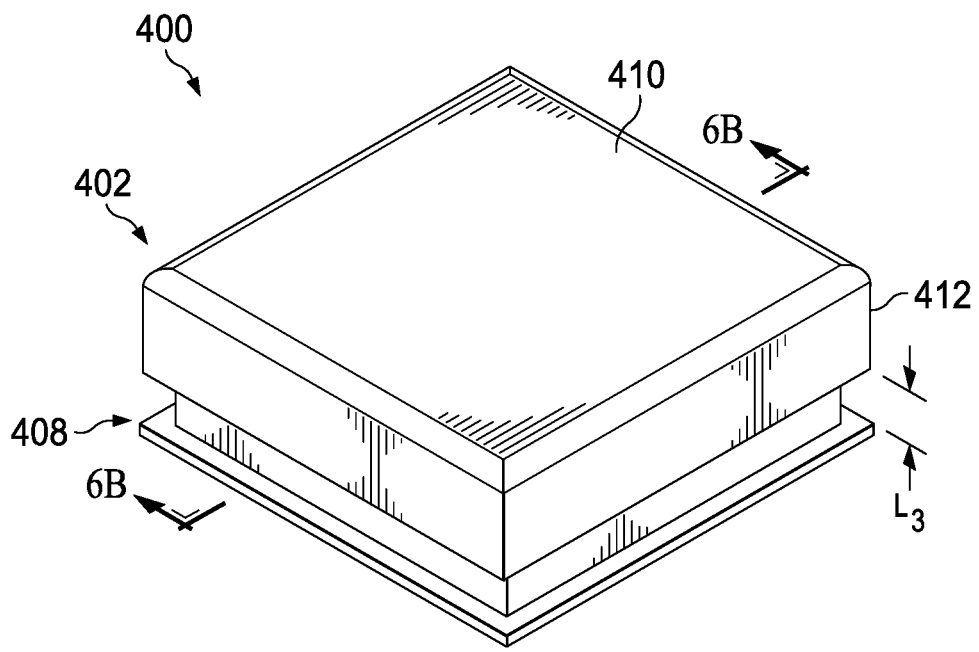
Figure 6B:
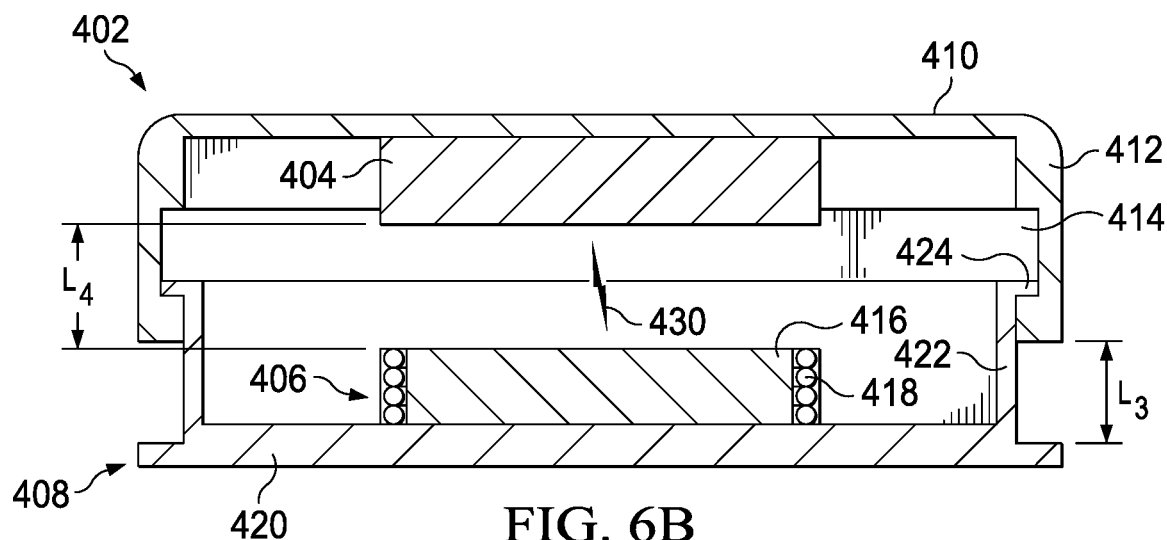

The magnetic field may be generated by the electromagnet 406 (using a current such as current in the graph 802) based on detecting that the key assembly 400 is in an active state. FIG. 6A is a view of the key assembly 400 in a raised position based on being in an active state. The FIG. 6B is a cross-section of the key assembly 400 of the FIG. 6A as generally indicated by section lines labeled "6B" in FIG. 6A. The electromagnet 406 is generating a magnetic field 430. The electromagnet 406 raises the key cover 402 to the raised position based on generation of the magnetic field 430. As previously discussed, the key assembly 400 receives an input based on a detecting that the key cover 402 is physical depressed while in an active state. By raising the key cover 402, the key assembly 400 enables the key cover 402 to generate the input based on a keystroke. Thus, the key assembly 400 is operable to receive the input via the key cover 402 when at the raised position. In addition, the key assembly 400 enables a user of the key assembly to identify that the key assembly is in the active state based on the physical location of the key cover, which in the case is in the raised position. In the raised position, the base 408 and the key cover 402 are separated by a distance $L_3$; the magnet 404 and the electromagnet 406 are separated by a distance $L_4$. The distance $L_3$ (FIGS. 6A and 6B) is larger than the distance $L_1$ (FIGS. 5A and 5B) and distance $L_4$ (FIGS. 6A and 6B) is larger than the distance $L_2$ (FIGS. 5A and 5B). Thus, the raised position is at a higher vertical elevation than the lower position. The key assembly 400 moves a vertical distance from the lowered to the raised position. The key cover 402 moves vertical distance equal to the distance $L_3$ minus the distance $L_1$. The magnet 404 moves vertical distance equal to the distance $L_2$ minus the distance $L_4$. Advantageously, a user of the key assembly 400 can identify whether the key assembly 400 is in an active state or inactive state based on the vertical displacement (e.g., based on touch alone).

Figure 7A:
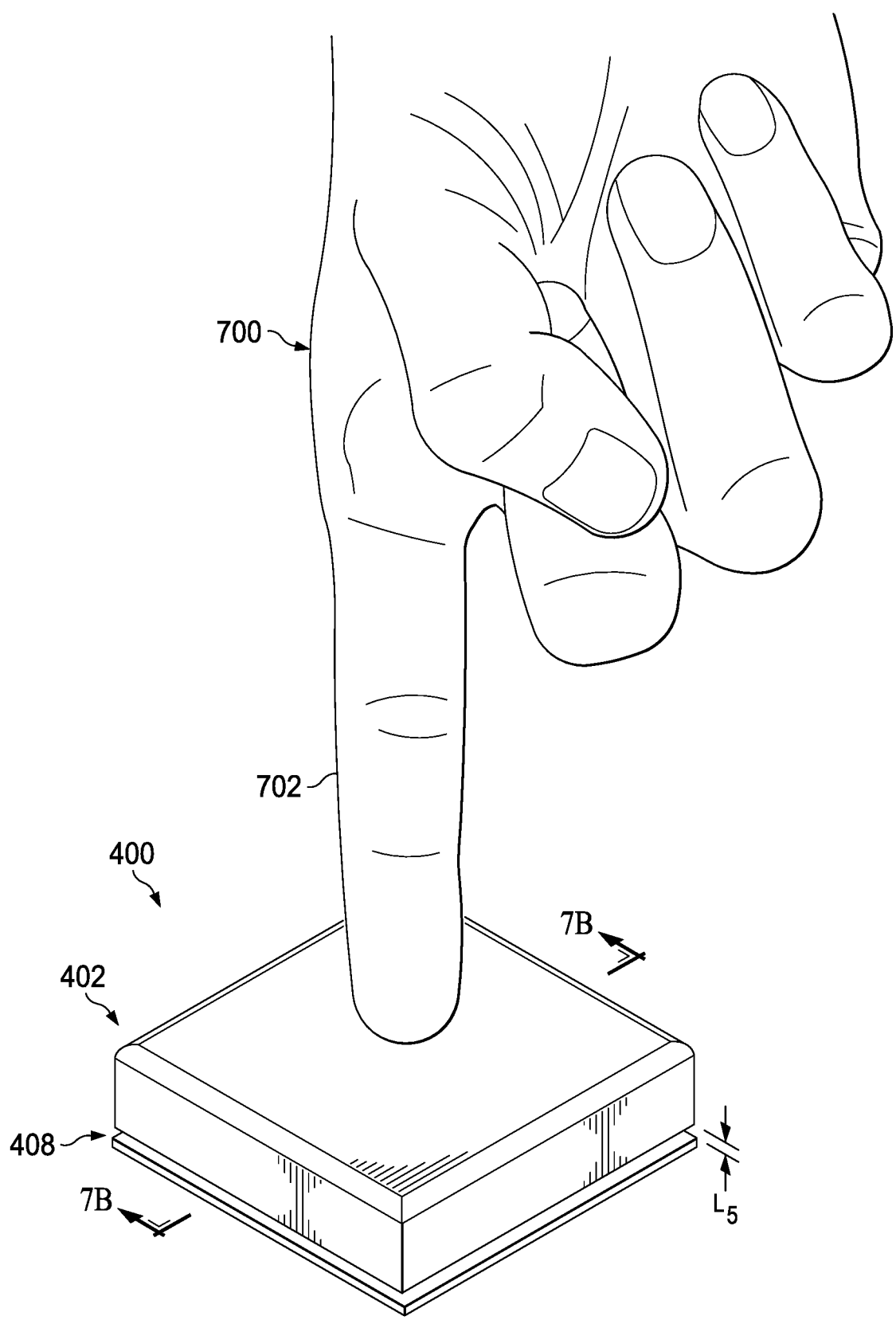
Figure 7B:
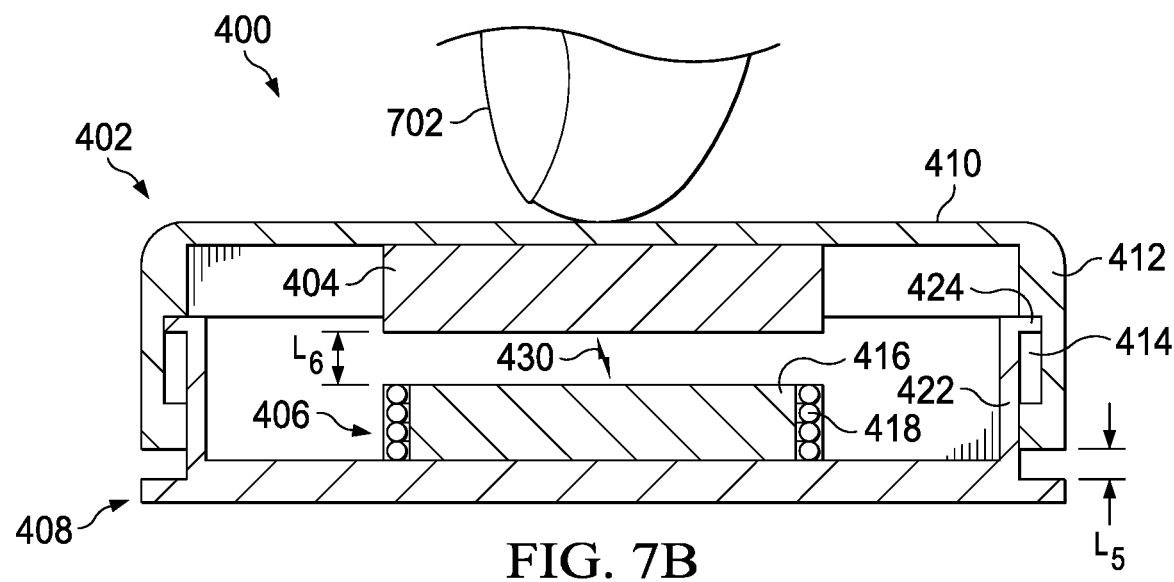

As discussed above, the key assembly 400 is operable to receive an input via the key cover 402 when at the raised position as illustrate in FIGS. 6A and 6B. The FIG. 7A is a view of the key assembly 400 in an active state and receiving the input via the key cover 402 based on being depressed by a user. The FIG. 7B is a cross-section of the key assembly 400 of the FIG. 7A as generally indicated by section lines labeled "7B" in FIG. 7A. The user's hand 700 and finger 702 apply a force to depress the key cover 402. In the depressed position, the base 408 and the key cover 402 are separated by a distance $L_5$, where $L_1 \leq L_5 \leq L_3$; the magnet 404 and the electromagnet 406 are separated by a distance $L_6$, where $L_2 \leq L_6 \leq L_4$. The key assembly 400 detects (e.g., using a controller, a processor, and/or sensor) that the key cover 402 is physical depressed while in the active state and generates the input based on the detection. The key assembly 400 can transmit the input to the controller and/or the processor.

Figure 9A:
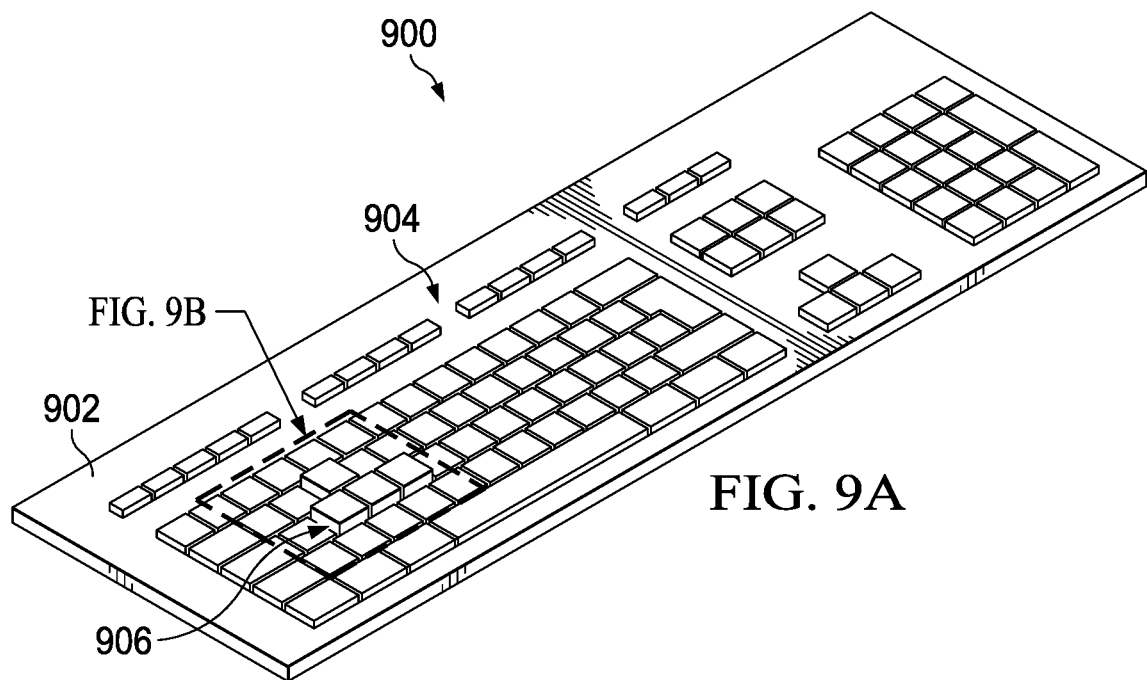
FIGS. 9A, 9B, and 9C illustrate a keyboard device, according to some embodiments of the present disclosure.

FIG. 9A illustrates a keyboard device 900 which includes a plurality of key assemblies, according to some embodiments of the present disclosure. The keyboard device 900 comprises a housing 902 and a set of key assemblies, which includes a corresponding set of key covers 904 and 906. The set of key covers 904 corresponds to a first subset of the key assemblies. Each in the first subset of the key assemblies is in an inactive state. The set of key covers 906 comprises key covers 906a, 906b, 906c, and 906d. The set of key covers 906 corresponds to a second subset of the key assemblies. Each in the second subset of the key assemblies is in an active state. The keyboard device 900 receives power from a power source. When powered on, the keyboard device 900 actively receives current from the power source and the key covers 904 and 906 provide a tactile output by being selectively raised or lowered (e.g., by a key displacement actuator) based on whether they are active or inactive. Each of the plurality of key assemblies can be displaced independently of others of the plurality of key assemblies on the keyboard device 900. The set of key covers 906 is raised based on being active. The set of key covers 904 is lowered based on being active.

Figure 9B:
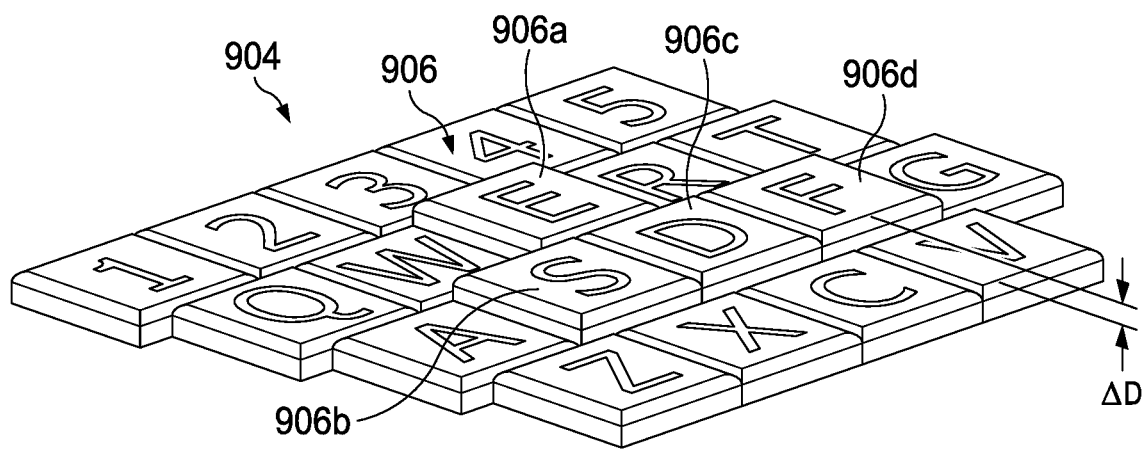

FIG. 9B illustrates a detailed view of some of the plurality of key assemblies of the keyboard device 900 of FIG. 9A. This detailed view illustrates key covers corresponding to alphanumeric characters including 1, 2, 3, 4, 5, Q, W, E, R, T, A, S, D, F, G, Z, X, C, and V. The set of key covers 904 includes the key covers corresponding to the alphanumeric characters 1, 2, 3, 4, 5, Q, W, R, T, A, G, Z, X, C, and V. The set of key covers 906 includes the key covers 906a, 906b, 906c, and 906d corresponding to the alphanumeric characters E, S, D, and F, respectively.

Each of the key covers 904 and 906 provides a tactile output by being selectively raised or lowered (e.g., by a key displacement actuator) based on whether they are active or inactive. The set of key covers 904 are lowered because the corresponding key assemblies (in which the key covers 904 are contained) are in the inactive state. The set of key covers 906 are raised because the corresponding key assemblies (in which the key covers 906 are contained) are in the active state. Each of the of key covers 906 is elevated above the each of the set of key covers 904 by a distance AD. This vertical displacement of the active key covers above the inactive key covers enables a user to distinguish between the active key assemblies and inactive key assemblies based only on touch. For example, a user may move their hand across the key covers and determine, based only on the vertical displacement, that the key covers 906 corresponding to the alphanumeric characters E, S, D, and F are active and that all other keys are inactive.

Each of the of key covers 906 is operable to receive an input based on being elevated. The user may press any of the active key covers 906 to cause the keyboard device 900 to generate an input signal. A force applied to any of the key covers 906 depresses the key cover and causes the keyboard device 900 to generate a signal corresponding to one of the alphanumeric characters E, S, D, or F, as the case may be. Each of the of key covers 904 is inoperable to receive an input based on being lowered. A force applied to any of the key covers 906 does not further depress the key cover and the keyboard device 900 does not generate a signal. The keyboard device 900 generates no output signal when the user presses any of the inactive key covers 904.

Figure 9C:
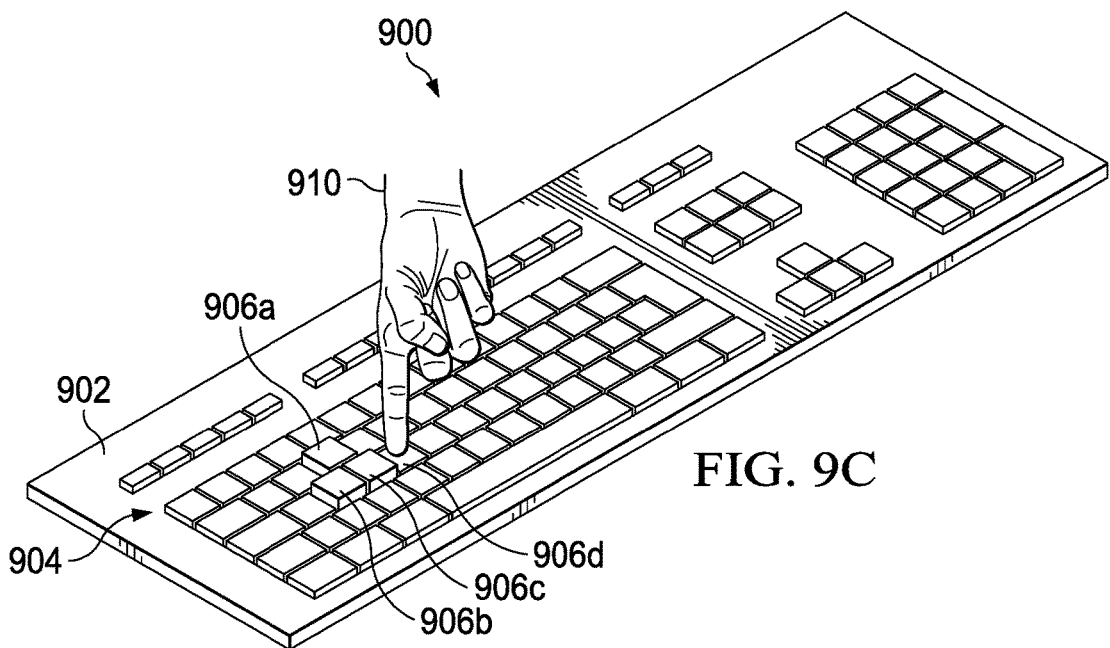

FIG. 9C illustrates a hand 910 (e.g., of a user) applying a keystroke to an active key assembly on the keyboard device 900 of FIGS. 9A and 9B. A finger on the hand 910 applies a force to the key cover 906d, which depresses the key cover 906d. The corresponding key assembly detects (e.g., using a controller, a sensor, and/or a processor) that the key cover 906d is physical depressed while in the active state and generates the input based on the detection. In the example of the key cover 906d, the may include a signal encoded based on a character encoding protocol to correspond to the letter F. The key assembly can transmit the input to the controller and/or the processor.

Figure 10A:
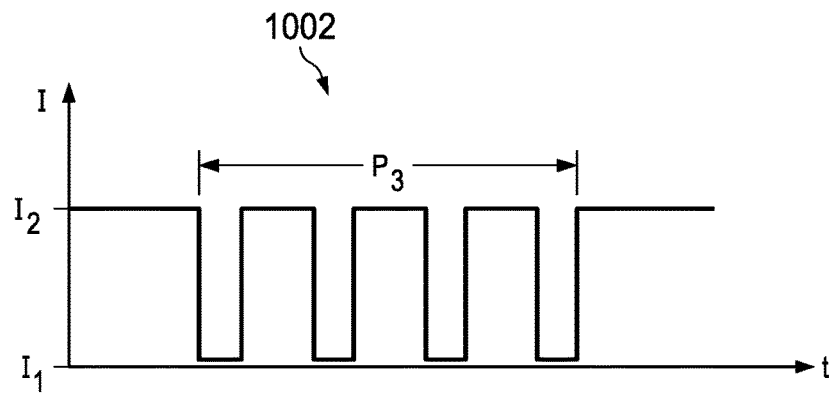
FIGS. 10A and 10B illustrate graphs of current varying over time at different frequencies, according to some embodiments of the present disclosure.
Figure 10B:
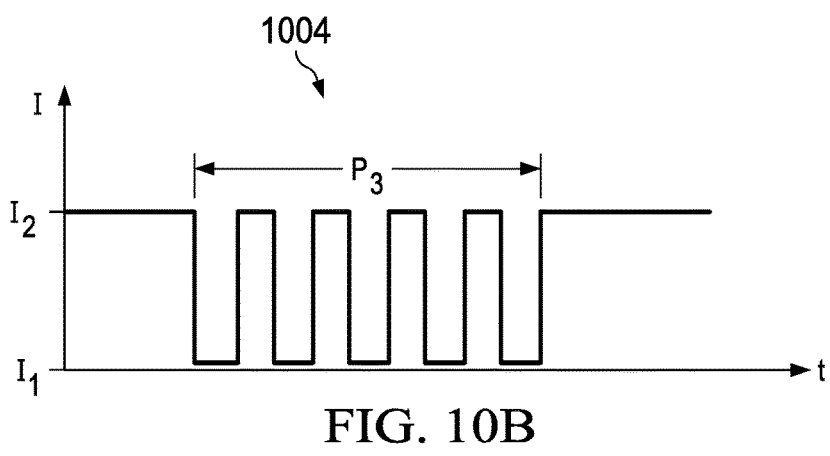

Each of the key covers 904 and 906 can provide a tactile output by being selectively vibrated (e.g., by a key displacement actuator). An intensity and/or frequency of the vibration can vary on a key-by-key basis. Thus, each of the key covers 906a, 906b, 906c, and 906d can be varied individually from each other and the intensity and/or frequency of the vibration can be different for each key cover. The key displacement actuator may include an electromagnet that cyclically activates and stops a magnetic field (based on a current). Oscillating the magnetic field causes to a magnet attached to the key cover increase or decrease a force applied to the key cover as described with respect to the key assembly 400. As an example, FIGS. 10A and 10B illustrate graphs 1002 and 1004 of current (I) over time (t) at different frequencies. For a period of time $P_3$, the currents cycle between a first current $I_1$ and a second current $I_2$. During the same period of time $P_3$, the graph 1002 includes four cycles and the graph 1004 includes five cycles. Thus, the current in the graph 1004 operates at a higher frequency than that in the graph 1002. A force is exerted on the magnet based on the magnetic field generated by the electromagnet based on the current. The force on the magnet can cause the attached key cover to displace or vibrate based on whether the key is depressed by a keystroke. For example, while depressed by a keystroke, an active key may vibrate to provide a tactile feedback based on the keystroke. In the example of FIG. 9C, the key cover 906d (which is active and is depressed by a keystroke) may be vibrated a first frequency. The vibration at the first frequency results from a key displacement actuator operating on a current oscillating at the first frequency (e.g., the current in the graph 1002). Because the hand 910 is resisting movement of the key cover 906d, any force applied to the key cover 906d is transferred to the hand 910 (e.g., as a vibration applied to a finger on the hand 910). Alternatively, while not depressed by a keystroke, an active key may vibrate to distinguish itself from other active keys. In the example of FIG. 9C, the key cover 906a (which is active and is not depressed by a keystroke) may be vibrated a second frequency, which results from a key displacement actuator operating on a current oscillating at the second frequency (e.g., the current in the graph 1004). The key cover 906a is free to move, for example, because it is not depressed by a keystroke. Any force applied to the key cover 906a causes the key cover 906a to vertically displace. Thus, the current oscillating at the second frequency force causes the key cover to move vertically up and down at the second frequency. Such a vibration may help a user to locate the key cover 906a based on touch alone. This can enable a blind person to use the keyboard device 900 to provide input and/or enable sighted person to use the keyboard device 900 without taking their eyes off a display screen.

Figure 11:
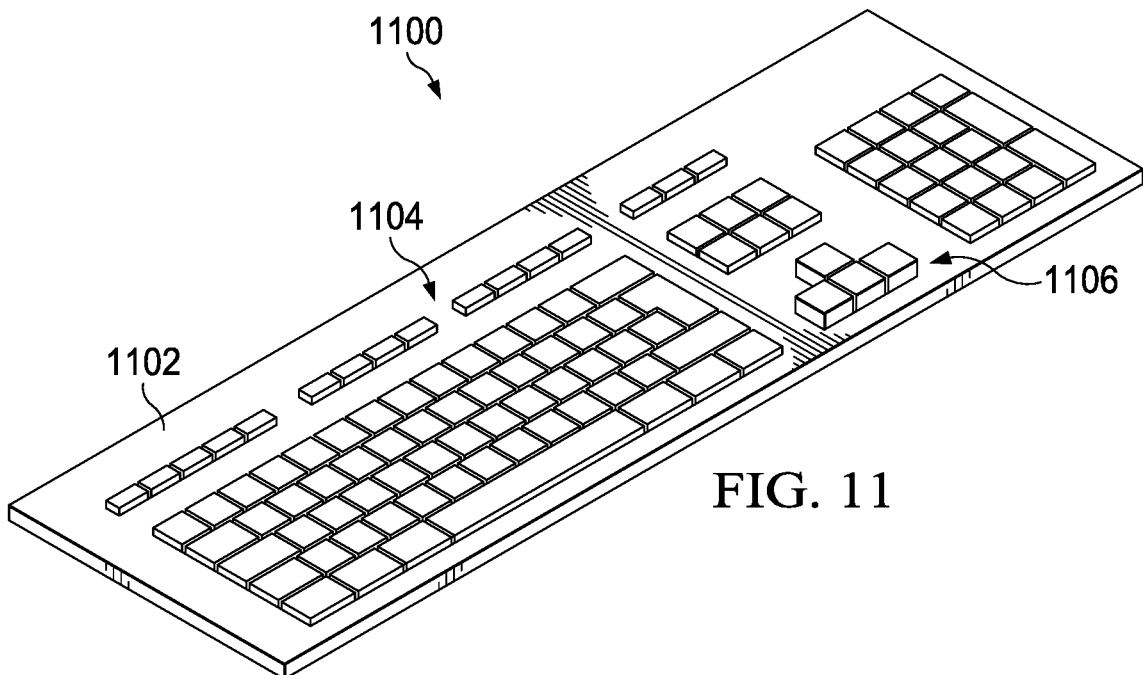
FIGS. 11, 12, 13A, 13B, and 14 illustrate example operations of keyboard devices, according to some embodiments of the present disclosure.

FIG. 11 illustrates a keyboard device 1100, according to some embodiments of the present disclosure. The keyboard device 1100 comprises a housing 1102 and a set of key assemblies, which includes a corresponding set of key covers 1104 and 1106. The set of key covers 1104 corresponds to a first subset of the key assemblies. Each in the first subset of the key assemblies are in an inactive state. The set of key covers 1106 corresponds to a second subset of the key assemblies. Each in the second subset of the key assemblies are in an active state. Each of the key covers 1106 (and their key assemblies) correspond to a distinct directional input, i.e., up, down, left, or right. Each of the key covers 1104 and 1106 provides a tactile output by being selectively raised or lowered (e.g., by a key displacement actuator) based on whether they are active or inactive. The set of key covers 1104 are lowered because the corresponding key assemblies (in which the key covers 1104 are contained) are in the inactive state. The set of key covers 1106 are raised because the corresponding key assemblies (in which the key covers 1106 are contained) are in the active state. The key covers 1104 being lowered prevents them from receiving input. The key covers 1106 being raised enables them to receive input.

The configuration illustrated in FIG. 11 can be used to limit possible inputs generated by the keyboard device 1100 to a set of acceptable values. In some examples, the keyboard device 1100 is coupled to a computing system that is executing a gaming application (e.g., a video game) that associates gaming actions with only the second subset of the key assemblies (e.g., only the key covers 1106 and not the key covers 1104). The keyboard device 1100 improves the experience of playing the gaming application by elevating the key covers 1106 above key covers 1104 to reduce the likelihood of a user pressing any of the key covers 1104, which are ineffective to control the gaming application.

Figure 12:
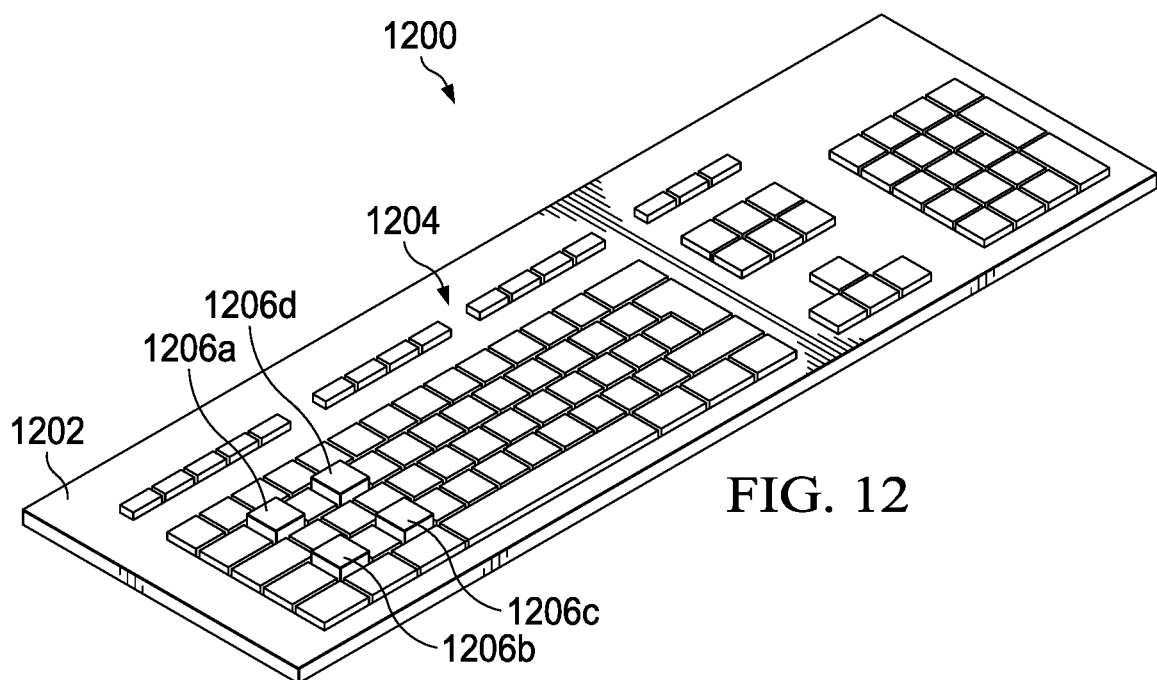

Any combination of key covers on an I/O device can be activated or deactivated. FIG. 12 illustrates a keyboard device 1200, according to some embodiments of the present disclosure. The keyboard device 1200 comprises a housing 1202 and a set of key assemblies, which includes a corresponding set of key covers 1204 and 1206 (i.e., 1206a, 1206b, 1206c, and 1206d). None of the key covers 1206a, 1206b, 1206c, and 1206d is adjacent to one another. The key covers 1204 and 1206 provide a tactile output by being selectively raised or lowered (e.g., by a key displacement actuator) based on whether they are active or inactive. The set of key covers 1204 are lowered based on the corresponding key assemblies being in an inactive state. The key covers 1204 being lowered prevents them from receiving input. The set of key covers 1206 are raised based on the corresponding key assemblies being in an active state. The key covers 1206 being raised enables them to receive input. Each of the key covers 1206 (and their key assemblies) correspond to a distinct letter. The configuration illustrated in FIG. 12 can be used to limit possible inputs generated by the keyboard device 1200 to a set of acceptable values and to prevent selection of invalid keys. For example, the key covers 1206 may be raised based on a prediction of which key inputs are likely to be next based on previous inputs (e.g., predictive typing, automatic completing of words). The key covers 1206 may correspond to a prediction of a next letter in a word or phrase being input via the keyboard device 1200.

Figure 13A:
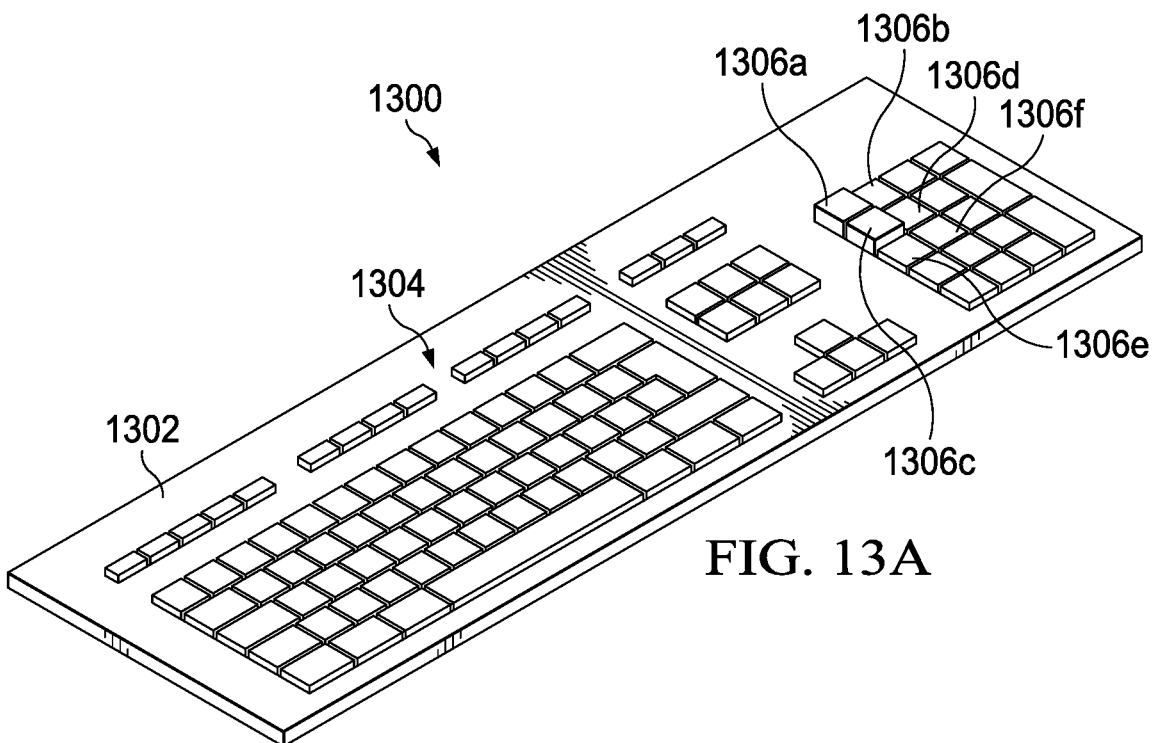
Figure 13B:
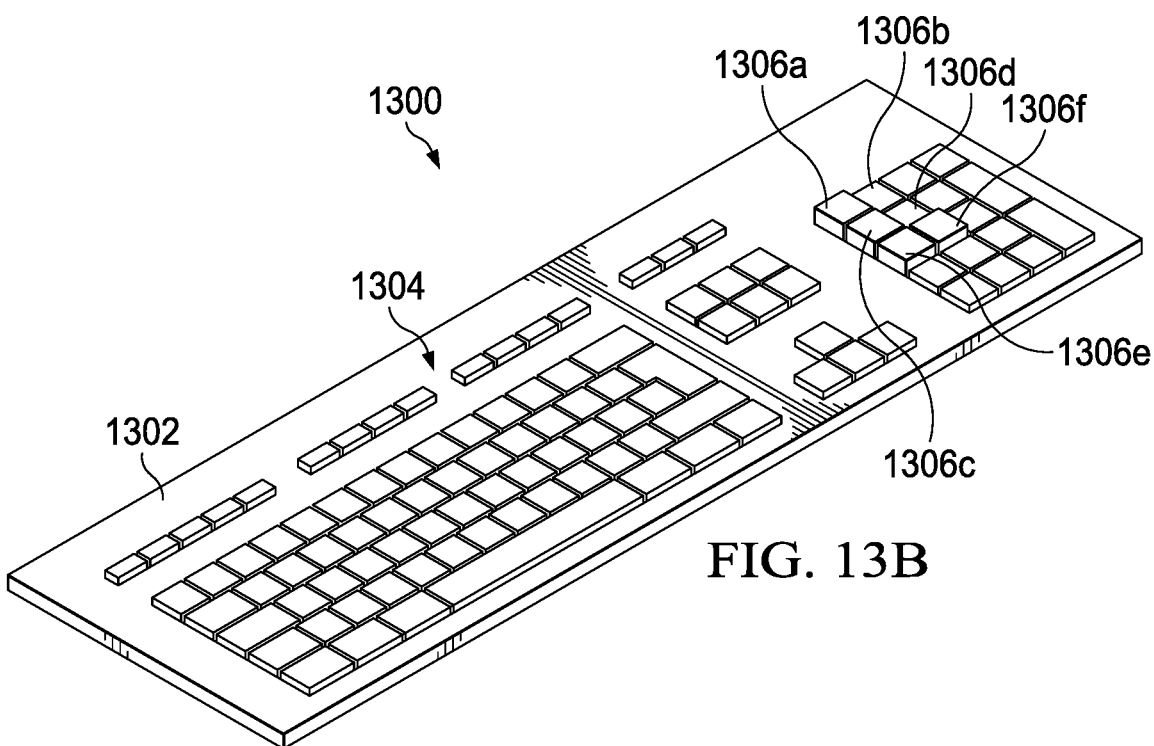

FIGS. 13A and 13B illustrate a keyboard device 1300, according to some embodiments of the present disclosure. The keyboard device 1300 comprises a housing 1302 and a set of key assemblies, which includes a corresponding set of key covers 1304 and 1306 (i.e., key covers 1306a, 1306b, 1306c, 1306d, 1306e, and 1306f). The key covers 1304 and 1306 provide a tactile output by being selectively raised or lowered (e.g., by a key displacement actuator) based on whether they are active or inactive. The set of key covers 1304 are lowered based on the corresponding key assemblies being in an inactive state. The key covers 1304 being lowered prevents them from receiving input. The set of key covers 1306 are raised based on the corresponding key assemblies being in an active state. The key covers 1306 being raised enables them operable to receive input. Each of the key covers 1306 (and their key assemblies) correspond to a distinct number. The configuration illustrated in FIGS. 13A and 13B can be used to provide a tactile output based on a pattern created by the raised key covers. In this example, the key covers 1306 correspond to a six-dot braille cell. In FIG. 13A, the key covers 1306a and 1306c are active in the braille cell, which corresponds to the letter b in braille. In FIG. 13B, the key covers 1306a, 1306c, 1306e, and 1306f are active in the braille cell, which corresponds to the letter v in braille. Key covers of the present disclosure can provide tactile output to communicate any information based on a pattern of raised key covers. For example, FIG. 14 shows an example of a shape formed by the pattern of raised key covers.

Figure 14:
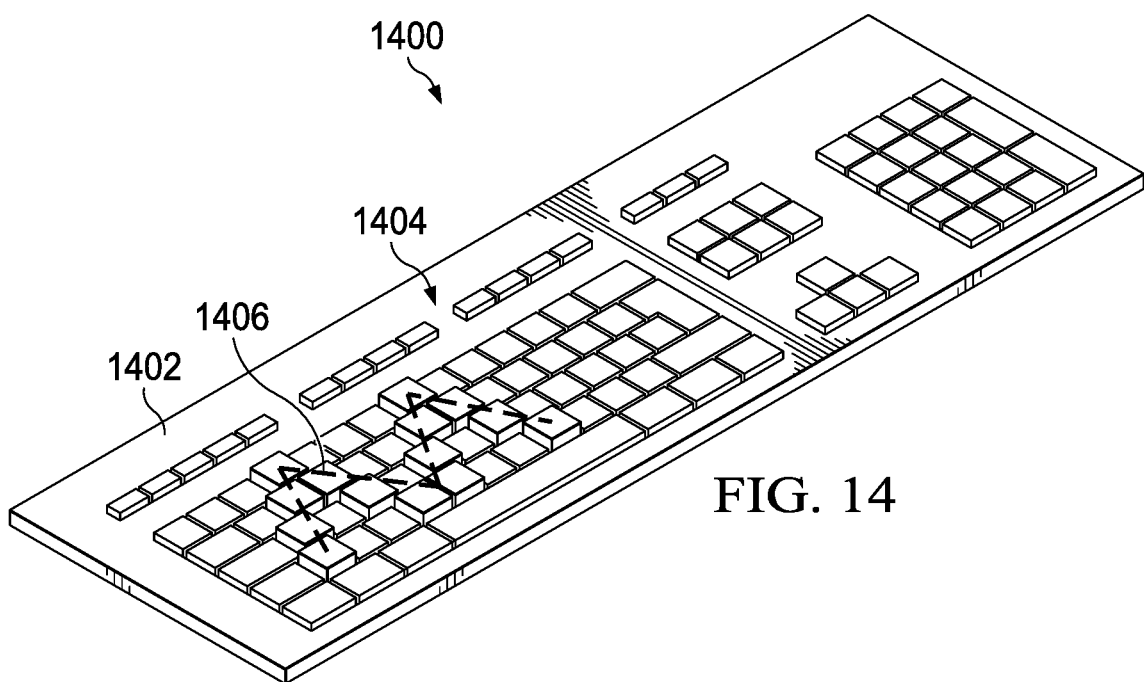

FIG. 14 illustrates a keyboard device 1400, according to some embodiments of the present disclosure. The keyboard device 1400 comprises a housing 1402 and a set of key assemblies, which includes a corresponding set of key covers 1404 and 1406. The key covers 1404 and 1406 provide a tactile output by being selectively raised or lowered (e.g., by a key displacement actuator) based on whether they are active or inactive. The set of key covers 1404 are lowered based on the corresponding key assemblies being in an inactive state. The key covers 1404 being lowered prevents them from receiving input. The set of key covers 1406 are raised based on the corresponding key assemblies being in an active state. The key covers 1406 being raised enables them operable to receive input. In this example, the pattern created by the raised key covers 1406 forms a zig-zag shape. The configuration illustrated in FIG. 14 can be used to provide a tactile output based on a pattern created by the raised key covers. The shape may be used to output information to a user and may allow the user, e.g., to feel the shape of an object represented on a computing device. The keys may render any pattern including, e.g., a checkered pattern, geometric shapes, and the like.

It is noted that the FIGS. 11, 12, 13A, 13B, and 14 illustrate keyboard devices, each of which is an example of the I/O device 102 of FIG. 1. These Figures illustrate exemplary operations by an I/O device of the present disclosure. While these Figures are described with respect to separate I/O devices, in some cases, a single I/O device of the present disclosure can perform all of the operations illustrates in these Figures.

Figure 15:
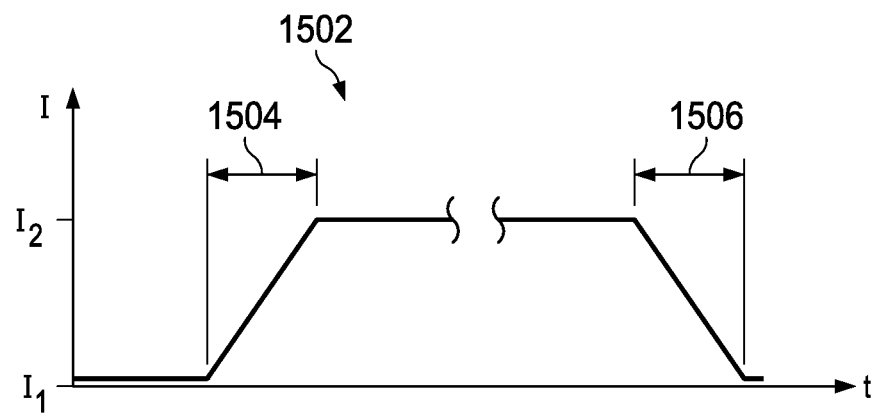
FIG. 15 illustrates another graph of current varying over time, according to some embodiments of the present disclosure.

FIG. 15 illustrates a graph 1502 of current (I) varying over time (t). The current increases from a first current $I_1$ to a second current $I_2$ over a period of time 1504. The current remains at the second current $I_2$ until a period of time 1506 during which the current decreases from the first current $I_1$ to the second current $I_2$. Each of the durations of time 1504 and 1506 are a transition time that enable the current to be provided to a key assembly (e.g., key assembly 400) to raise or lower a key cover. In some embodiments, the durations of time 1504 and 1506 last approximately several seconds, which causes the key covers gradually raise during start-up of a device (e.g., in the duration of time 1504) and/or the keys gradually lower during shout-down of the device (e.g., in the duration of time 1506). In some examples, all the key covers on a device gradually raise or lower simultaneously. In other examples, only a limited subset of the key covers on the device gradually raise or lower simultaneously.

Figure 16:
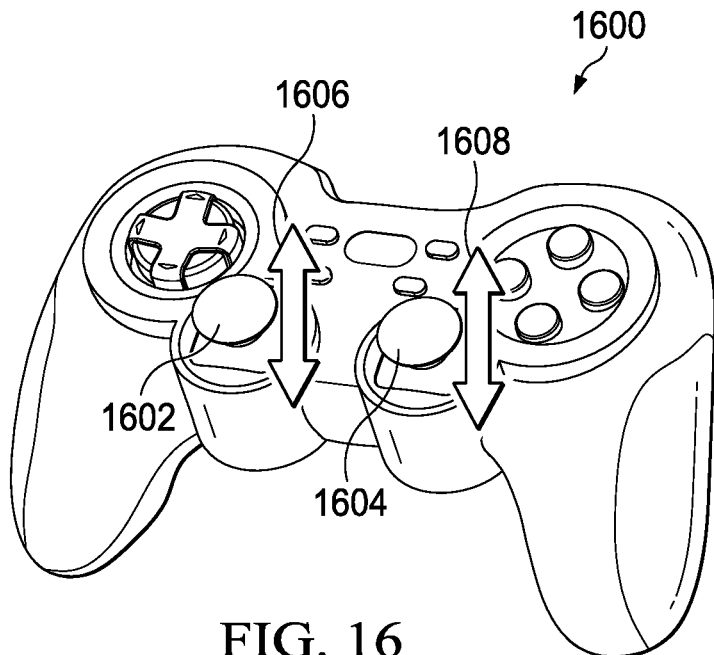
FIG. 16 illustrates example operations of a controller device, according to some embodiments of the present disclosure.

FIG. 16 illustrates a controller device 1600, according to some embodiments of the present disclosure. The controller device is an example of the controller device 300 of FIG. 3. The controller device 1600 includes component and can perform operations as described with respect to the controller device 300 of FIG. 3 and are not repeated here only for the sake of brevity. The controller device 600 comprises key assemblies, which include corresponding key covers 1602 and 1604 and key displacement actuators. The key covers 1602 and 1604 correspond to directional keys assemblies for which the key covers can be tilted to provide a directional input. Advantageously, the key displacement actuators apply forces to each of the key covers 1602 and 1604 to produce vibration feedback. The key covers 1602 vibrates at a first frequency 1606. The key covers 1604 vibrates at a second frequency 1608. The second frequency 1608 is higher than the first frequency 1606. As an example, the first frequency 1606 and the second frequency 1608 can lie in a range of about 150-180 Hz. The different vibration frequencies may cause by a current received at the key displacement actuator (e.g., currents in the graphs 1002 and 1004 of FIGS. 10A and 10B). In a gaming application, the different vibration frequencies may be generated based on a type and/or intensity of action being executed in the gaming application. For example, the second frequency 1608 may correspond to a gaming action of firing an automatic weapon and the first frequency 1606 may correspond to a gaming action of firing a semi-automatic weapon. The frequencies are programmable and can provide differentiated feedback at each fingertip for many different applications.

Some embodiments of the present disclosure utilize to a key displacement actuator that includes a magnet coupled to a key cover and an electromagnet coupled to a base. However, embodiments of the present disclosure are not limited to such examples. In other embodiments, the magnet is replaced by a material comprising metal. In still other embodiments, the magnet and the electromagnet may be swapped such that the electromagnet is coupled to the key cover and the magnet coupled to the base.

Figure 17:
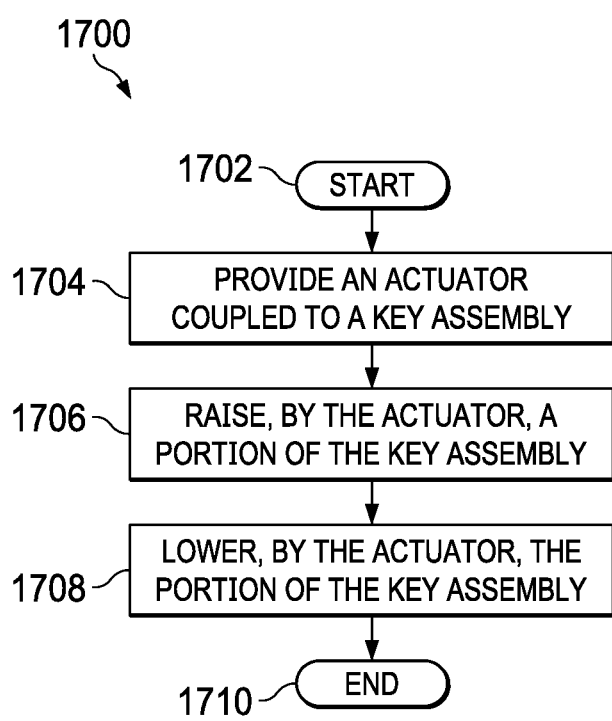
FIG. 17 illustrates a method for displacing a portion of a key assembly, according to some embodiments of the present disclosure.

FIG. 17 illustrates a method 1700 for displacing a portion of a key assembly. The method 1700 comprises: 1702, initiation point; 1704, provide an actuator coupled to a key assembly; 1706, raise, by the actuator, a portion of the key assembly; 1708, lower, by the actuator, a portion of the key assembly; and a termination point 1710. The method 1700 may be executed by one or more processor (e.g., in an apparatus, an I/O device, a keyboard device, a server, or other device). What follows is a description of further details of the method 1700.

Method 1700 begins at 1702, which may coincide with a start/end point of other methods, logic, routines, and/or applications.

At 1704, an actuator coupled to a key assembly is provided. An actuator can include any system capable of displacing a key. For example, an actuator is inclusive of a moveable shaft; a magnet and a metallic member; an electromagnet and a metallic member; a permanent magnet and an electromagnet; and/or any other system capable of displacing a key. The actuator may be coupled to at least a portion of the key assembly. For example, the actuator may be coupled to a key cover, a base, a surface, or any member of a key assembly.

At 1706, the actuator raises a portion of the key assembly. The actuator may raise the portion of the key assembly based on a status of the key assembly and/or of the device on which the key assembly is located. For example, the portion of the key assembly is raised based on determining that a joystick on which the key is located is switched from powered off to powered on. As another example, the portion of the key assembly is raised based on determining that the key assembly is associated with a function on a computing device such as determining that the "S" key is associated with a function to save a document. Such raising may provide output to confirm the identity of the key assembly associated with the function. In some examples, the actuator raises the portion of the key assembly based on a determination that the key assembly is active (e.g., in an active state). In other examples, the actuator raises the portion of the key assembly based on a determination that the key assembly is inactive (e.g., in an inactive state). In some cases, the portion of the key assembly is maintained at an elevated position for only a short period of time (e.g., in the range of fractions of a second to a few seconds). In other cases, the portion of the key assembly is maintained at an elevated position for indefinitely (e.g., as long as a device is powered on, until a status of the key assembly changes, and the like).

At 1708, the actuator lowers the portion of the key assembly. The actuator may lower the portion of the key assembly based on the status of the key assembly and/or of the device on which the key assembly is located. For example, the portion of the key assembly is lower based on determining that a joystick on which the key is located is switched from powered on to powered off. As another example, the portion of the key assembly is lowered based on determining that the key assembly is disassociated with a function on a computing device such as determining that the "S" key is associated with a function to save a document. Such lowering may provide output to confirm the identity of the key assembly disassociated with the function. In some examples, the actuator lowers the portion of the key assembly based on a determination that the key assembly is active (e.g., in an active state). In other examples, the actuator lowers the portion of the key assembly based on a determination that the key assembly is inactive (e.g., in an inactive state). In some cases, the portion of the key assembly is maintained at a lowered position for only a short period of time (e.g., in the range of fractions of a second to a few seconds). In other cases, the portion of the key assembly is maintained at an elevated position for indefinitely (e.g., as long as a device is powered on, until a status of the key assembly changes, and the like).

In some embodiments, the method 1700 can loop between 1706 and 1708 to raise and/or lower the portion of the key assembly more than once. The method 1700 ends at 1710, which may coincide with a start/end point of other methods, logic, routines, and/or applications In some embodiments, an I/O device executes at least a portion of the method 1700. In other embodiments, a remote processing device is in communication with, and remote from or otherwise physically separate from, the I/O device. In such an example, the remote processing device may transmit signal that causes the I/O device to execute the method 1700 (e.g., based on an application executing on the remote processing device).

While this specification contains many specific implementation details, these should not be construed as limitations on the scope of any inventions or of what may be claimed, and rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

The following examples, pertain to some embodiments of the present disclosure.

Example 1 is an apparatus comprising a key assembly comprising a key cover; a magnet coupled to the key cover; and an electromagnet operable to displace the key cover based on whether the key assembly is in an active state or an inactive state, wherein: in the active state, the electromagnet is operable to raise the key cover to a first position based on generation of a magnetic field, and in the inactive state, the electromagnet is operable to lower the key cover to a second position based on cessation of the magnetic field.

Example 2 includes the subject matter of Example 1, and may further comprise the key assembly being operable to receive an input via the key cover when at the first position and the key assembly being not operable to receive the input via the key cover when at the second position.

Example 3 includes the subject matter of Example 2, and may further comprise the key assembly being operable to transmit an input to a processor.

Example 4 includes the subject matter of any one or more of Examples 1-3, and may further comprise the key assembly being a first key assembly and the key cover being a first key cover; and further comprising a second key assembly, the second key assembly comprising a second key cover, wherein the first key assembly is in the active state and the first key cover is at the first position and the second key assembly is in the inactive state and the second key cover is at the second position.

Example 5 includes the subject matter of any one or more of Examples 1-4, and may further comprise the first position being at a higher vertical elevation than the second position.

Example 6 includes the subject matter of any one or more of Examples 1-5, and may further comprise a processor operable to set an activation state of the key assembly, the activation state of the key assembly comprising the active state and the inactive state.

Example 7 includes the subject matter of any one or more of Examples 1-6, and may further comprise a power source operable to supply a current to the electromagnet, wherein the electromagnet is operable to generate the magnetic field based on the current.

Example 8 includes the subject matter of Example 7, and may further comprise the electromagnet comprising a coil operable to transmit the current around a metal core to generate the magnetic field.

Example 9 includes the subject matter of any one or more of Examples 1-8, and may further comprise the key cover comprising a sidewall operable to limit lateral displacement of the key cover.

Example 10 includes the subject matter of Example 9, and may further comprise the sidewall comprising a lip operable to limit vertical displacement of the key cover.

Example 11 includes the subject matter of any one or more of Examples 1-10, and may further comprise a base supporting the electromagnet.

Example 12 includes the subject matter of Example 11, and may further comprise the electromagnet being operable to rest the key cover on the base based on the cessation of the magnetic field.

Example 13 includes the subject matter of Example 11 and/or 12, and may further comprise the base comprising a sidewall operable to limit lateral displacement of the key cover.

Example 14 includes the subject matter of any one or more of Examples 1-13, and may further comprise the key cover comprising human-readable indicia identifying the key assembly.

Example 15 includes the subject matter of any one or more of Examples 1-14, and may further comprise the magnet comprising a permanent magnet.

Example 16 includes the subject matter of any one or more of Examples 1-5, and may further comprise the magnetic field exerting a force on the magnet.

Example 17 includes the subject matter of any one or more of Examples 1-16, and may further comprise a circuit coupling the key assembly to processor.

Example 18 includes the subject matter of any one or more of Examples 1-17, and may further comprise a die coupled to a circuit board with solder.

Example 19 is a system comprising: a first key assembly comprising: a first key cover; a first magnet coupled to the first key cover; and a first electromagnet operable to displace the first key cover based on whether the first key assembly is in an active state or an inactive state; and a second key assembly comprising: a second key cover; a second magnet coupled to the second key cover; and a second electromagnet operable to displace the second key cover based on whether the second key assembly is in the active state or the inactive state, wherein the first key cover and the second key cover are displaced independently of one another.

Example 20 includes the subject matter of Example 19, and may further comprise in the active state, the first electromagnet is operable to raise the first key cover to a first position based on generation of a first magnetic field, and in the inactive state, the first electromagnet is operable to lower the first key cover to a second position based on cessation of the first magnetic field.

Example 21 includes the subject matter of Example 19 and/or 20, and may further comprise in the active state, the second electromagnet is operable to raise the second key cover to a first position based on generation of a second magnetic field, and in the inactive state, the second electromagnet is operable to lower the second key cover to a second position based on cessation of the second magnetic field.

Example 22 includes the subject matter of any one or more of Examples 19-21, and may further comprise the key assembly being operable to receive an input via the key cover when at the first position and the key assembly being not operable to receive the input via the key cover when at the second position.

Example 23 includes the subject matter of Example 22, and may further comprise each of the first key assembly and the second key assembly being operable to transmit an input to a processor.

Example 24 includes the subject matter of any one or more of Examples 19-23, and may further comprise a housing operable to support the first key assembly and the second key assembly.

Example 25 includes the subject matter of any one or more of Examples 19-23, and may further comprise the first position being at a higher vertical elevation than the second position.

Example 26 includes the subject matter of any one or more of Examples 19-25, and may further comprise a processor operable to set an activation state of the first key assembly and the second key assembly, the activation state comprising the active state and the inactive state.

Example 27 includes the subject matter of any one or more of Examples 19-26, and may further comprise a power source operable to supply a current to the first electromagnet and the second electromagnet, wherein each of the first electromagnet and the second electromagnet is operable to generate the magnetic field based on the current.

Example 28 includes the subject matter of Example 27, and may further comprise each of the first electromagnet and the second electromagnet comprising a coil operable to transmit the current around a metal core to generate the magnetic field.

Example 29 includes the subject matter of any one or more of Examples 19-28, and may further comprise the key cover comprising a sidewall operable to limit lateral displacement of the key cover.

Example 30 includes the subject matter of Example 29, and may further comprise the sidewall comprising a lip operable to limit vertical displacement of the key cover.

Example 31 includes the subject matter of any one or more of Examples 19-30, and may further comprise a base supporting the electromagnet.

Example 32 includes the subject matter of Example 31, and may further comprise the electromagnet being operable to rest the key cover on the base based on the cessation of the magnetic field.

Example 33 includes the subject matter of Example 31 and/or 32, and may further comprise the base comprising a sidewall operable to limit lateral displacement of the key cover.

Example 34 includes the subject matter of any one or more of Examples 19-33, and may further comprise the key cover comprising human-readable indicia identifying the key assembly.

Example 35 includes the subject matter of any one or more of Examples 19-34, and may further comprise the magnet comprising a permanent magnet.

Example 36 includes the subject matter of any one or more of Examples 19-35, and may further comprise the magnetic field exerting a force on the magnet.

Example 37 includes the subject matter of any one or more of Examples 19-36, and may further comprise a circuit coupling the first key assembly and the second key assembly to processor.

Example 38 includes the subject matter of any one or more of Examples 19-37, and may further comprise a die coupled to a circuit board with solder.

Example 39 is a system comprising: a plurality of key assemblies, wherein each key assembly in the plurality of key assemblies comprises: a key cover; a magnet coupled to the key cover; and an electromagnet operable to displace the key cover based on whether the key assembly is in an active state or an inactive state, wherein: in the active state, the electromagnet is operable to raise the key cover to a first position based on generation of a magnetic field, and in the inactive state, the electromagnet is operable to lower the key cover to a second position based on cessation of the magnetic field; wherein the electromagnet in each key assembly of the plurality of key assemblies is operable to displace the key cover independent of others of the plurality of key assemblies.

Example 40 includes the subject matter of Example 39, and may further comprise the plurality of key assemblies comprising a first key assembly and a second key assembly; and wherein the first key assembly is in the active state and the first key cover is at the first position and the second key assembly is in the inactive state and the second key cover is at the second position.

Example 41 includes the subject matter of Example 39 and/or 40, and may further comprise each key assembly being operable to receive an input via the key cover when at the first position and each key assembly being not operable to receive the input via the key cover when at the second position.

Example 42 includes the subject matter of any one or more of Examples 39-41, and may further comprise each key assembly in the plurality of key assemblies being operable to receive an input via the key cover when at the first position and each key assembly in the plurality of key assemblies being not operable to receive the input via the key cover when at the second position.

Example 43 includes the subject matter of Example 42, and may further comprise each key assembly in the plurality of key assemblies being operable to transmit an input to a processor.

Example 44 includes the subject matter of any one or more of Examples 39-43, and may further comprise a housing configured to support the plurality of key assemblies.

Example 45 includes the subject matter of any one or more of Examples 39-43, and may further comprise the first position being at a higher vertical elevation than the second position.

Example 46 includes the subject matter of any one or more of Examples 39-45, and may further comprise a processor operable to set an activation state of each key assembly in the plurality of key assemblies, the activation state comprising the active state and the inactive state.

Example 47 includes the subject matter of any one or more of Examples 39-46, and may further comprise a power source operable to supply a current to the electromagnet, wherein the electromagnet is operable to generate the magnetic field based on the current.

Example 48 includes the subject matter of Example 47, and may further comprise the electromagnet comprising a coil operable to transmit the current around a metal core to generate the magnetic field.

Example 49 includes the subject matter of any one or more of Examples 39-48, and may further comprise the key cover comprising a sidewall operable to limit lateral displacement of the key cover.

Example 50 includes the subject matter of Example 49, and may further comprise the sidewall comprising a lip operable to limit vertical displacement of the key cover.

Example 51 includes the subject matter of any one or more of Examples 39-50, and may further comprise a base supporting the electromagnet.

Example 52 includes the subject matter of Example 51, and may further comprise the electromagnet being operable to rest the key cover on the base based on the cessation of the magnetic field.

Example 53 includes the subject matter of Example 51 and/or 32, and may further comprise the base comprising a sidewall operable to limit lateral displacement of the key cover.

Example 54 includes the subject matter of any one or more of Examples 39-53, and may further comprise the key cover comprising human-readable indicia identifying each key assembly in the plurality of key assemblies.

Example 55 includes the subject matter of any one or more of Examples 39-54, and may further comprise the magnet comprising a permanent magnet.

Example 56 includes the subject matter of any one or more of Examples 39-55, and may further comprise the magnetic field exerting a force on the magnet.

Example 57 includes the subject matter of any one or more of Examples 39-56, and may further comprise a circuit coupling each key assembly in the plurality of key assemblies to processor.

Example 58 includes the subject matter of any one or more of Examples 39-57, and may further comprise a die coupled to a circuit board with solder.

Example 59 is a method comprising: providing an electromagnet operable to displace a magnet coupled to a key cover within a key assembly; displacing, by the electromagnet, the key cover based on whether the key assembly is in an active state or an inactive, the displacing comprising: in the active state, raising the key cover to a first position based on generating of a magnetic field, and in the inactive state, lowering the key cover to a second position based on stopping the magnetic field.

Example 60 includes the subject matter of Example 59, and may further comprise: receiving a keystroke via the key cover while the key cover is at the first position; and preventing the keystroke via the key cover while the key cover is at the second position.

Example 61 includes the subject matter of Example 59 and/or 60, and may further comprise: the first position being at a higher vertical elevation than the second position.

Example 62 includes the subject matter of any one or more of Examples 59-61, may further comprise transmitting an input to a processor based on receiving the keystroke.

Example 63 includes the subject matter of any one or more of Examples 59-62, may further comprise setting an activation state of the key assembly, the activation state of the key assembly comprising the active state and the inactive state.

Example 64 includes the subject matter of any one or more of Examples 59-63, may further comprise receiving, by the electromagnet, a current from a power source; and generating, by the electromagnet, the magnetic field based on the current, the magnetic field exerting a force on the magnet.

Example 65 is a method comprising providing a key displacement actuator operable to displace a portion of a key assembly; displacing the portion based on whether the key assembly is in an active state or an inactive, the displacing comprising: in the active state, raising the portion to a first position based on activating the key displacement actuator, and in the inactive state, lowering the portion to a second position based on deactivating the key displacement actuator.

Example 66 includes the subject matter of Example 65, and may further comprise setting an activation state of the key assembly, the activation state of the key assembly comprising the active state and the inactive state.

Example 67 includes the subject matter of any one or more of Examples 65-66, may further comprise receiving, by the key displacement actuator, a current from a power source; and exerting, by the key displacement actuator, a force on the portion of the key assembly based on the current.

Example 68 is an apparatus comprising means to perform a method as specified in any of Examples 59-67.

Example 69 is a machine-readable storage including machine-readable instructions, when executed, to implement a method, realize an apparatus, or realize a system as specified in any of Examples 1-67.

Example 70 is a machine-readable medium including code, when executed, to cause a machine to perform the methods of any one of Examples 59-67.

Example 71 is an apparatus comprising: a processor; and a memory coupled to the processor to store instructions, the instructions, when executed by the processor, to perform the methods of any one of Examples 59-67.

Example 72 is a machine readable non-transitory storage medium having instructions stored thereon, wherein the instructions, when executed by at least one processor, causes the at least one processor to perform operations comprising: displacing, by an electromagnet, a magnet coupled to a key cover based on whether a key assembly is in an active state or an inactive, the displacing comprises: in the active state, raising the key cover to a first position based on generating a magnetic field, and in the inactive state, lowering the key cover to a second position based on stopping the magnetic field.

Example 73 includes the subject matter of Example 72, and may further comprise causing transmission of a current to the electromagnet.

Example 74 includes the subject matter of Example 72, and may further comprise detecting a keystroke via the key cover while the key cover is at the first position.

Example 75 is a machine readable non-transitory storage medium having instructions stored thereon, wherein the instructions, when executed by at least one processor, causes the at least one processor to perform operations comprising: displacing, by a key displacement actuator, a portion of a key assembly based on whether the key assembly is in an active state or an inactive, the displacing comprising: in the active state, raising the portion to a first position based on activating the key displacement actuator, and in the inactive state, lowering the portion to a second position based on deactivating the key displacement actuator.

Example 76 includes the subject matter of Example 75, and may further comprise causing transmission of a signal to the key displacement actuator.

Example 77 includes the subject matter of Example 76, and may further comprise detecting a keystroke via the portion while the portion is at the first position.

What is claimed is:

1. An apparatus, comprising:
   a key assembly, comprising:
      a key cover;
      a magnet coupled to the key cover;
      a key base; and
      an electromagnet, the electromagnet operable to vibrate the key cover based on whether the key assembly is in an active state or an inactive state, wherein:
         in the active state, the electromagnet is operable to vibrate the key cover based on generation of a magnetic field, and
         in the inactive state, the electromagnet is operable to not vibrate the key cover based on cessation of the magnetic field, and
         wherein whether the key assembly is in the active state or the inactive state is based on input by a user, an application programming interface (API), or an executable application.

2. The apparatus of claim 1, wherein the key assembly is a first key assembly including a first key cover, a first magnet, a first key base, and a first electromagnet operable to vibrate the first key cover at a first frequency, and further comprising:
   a second key assembly comprising:
      a second key cover;
      a second magnet coupled to the second key cover;
      a second key base; and
      a second electromagnet, the second electromagnet operable to vibrate the second key cover based on whether the second key assembly is in an active state or an inactive state, wherein:
         in the active state, the second electromagnet is operable to vibrate the second key cover at a second frequency different from the first frequency based on generation of a second magnetic field, and
         in the inactive state, the second electromagnet is operable to not vibrate the second key cover based on cessation of the second magnetic field, and
         wherein whether the second key assembly is in the active state or the inactive state is based on input by the user, the API, or the executable application.

3. The apparatus of claim 2, wherein the first key cover and the second key cover are vibrated at the first and second frequencies independently of each other.

4. The apparatus of claim 1, wherein the key assembly is a first key assembly including a first key cover, a first magnet, a first key base, and a first electromagnet operable to vibrate the first key cover at a first intensity, and further comprising:
   a second key assembly comprising:
      a second key cover;
      a second magnet coupled to the second key cover;
      a second key base; and
      a second electromagnet, the second electromagnet operable to vibrate the second key cover based on whether the second key assembly is in an active state or an inactive state, wherein:
         in the active state, the second electromagnet is operable to vibrate the second key cover at a second intensity different from the first intensity based on generation of a second magnetic field, and
         in the inactive state, the second electromagnet is operable to not vibrate the second key cover based on cessation of the second magnetic field, and
         wherein whether the second key assembly is in the active state or the inactive state is based on input by the user, the API, or the executable application.

5. The apparatus of claim 4, wherein the first key cover and the second key cover are vibrated at the first and second intensities independently of each other.

6. The apparatus of claim 1, wherein the electromagnet is further operable to displace the key cover based on whether the key assembly is in the active state or the inactive state, wherein:
   in the active state, the electromagnet is further operable to raise the key cover to a first position based on generation of the magnetic field, and
   in the inactive state, the electromagnet is further operable to lower the key cover to a second position based on cessation of the magnetic field.

7. The apparatus of claim 6, wherein the key assembly is operable to receive an input via the key cover when at the first position and the key assembly is not operable to receive the input via the key cover when at the second position.

8. The apparatus of claim 7, wherein the first position is at a higher vertical elevation than the second position.

9. A system comprising:
a plurality of key assemblies, wherein each key assembly in the plurality of key assemblies comprises:
  a key cover;
  a magnet coupled to the key cover;
  a key base; and
  an electromagnet, the electromagnet operable to displace and to vibrate the key cover relative to the key base based on whether the key assembly is in an active state or an inactive state, wherein:
    in the active state, the electromagnet is operable to raise the key cover to a first position and to vibrate the key cover based on generation of a magnetic field, and
    in the inactive state, the electromagnet is operable to lower the key cover to a second position and to not vibrate the key cover based on cessation of the magnetic field; and
  wherein whether the key assembly is in the active state or the inactive state is based on input by a user, an application programming interface (API), or an executable application; and
wherein the electromagnet in each key assembly of the plurality of key assemblies is operable to displace the key cover and to vibrate the key cover independent of other key covers of the plurality of key assemblies.

10. The system of claim 9, wherein the plurality of key assemblies comprises a first key assembly and a second key assembly; wherein the first key assembly is in the active state and the first key cover is at the first position and vibrated at a first frequency, and wherein the second key assembly is in the active state and the second key cover is at the first position and vibrated at a second frequency that is different from the first frequency.

11. The system of claim 10, wherein the plurality of key assemblies further comprises a third key assembly, wherein the third key assembly is in the inactive state and the third key cover is at the second position.

12. The system of claim 9, wherein each key assembly is operable to receive an input via the key cover when at the first position and each key assembly is not operable to receive the input via the key cover when at the second position.

13. The system of claim 9, further comprising:
determine a next keystroke input based on one or more previous keystroke inputs;
set the key cover of one or more key assemblies of the plurality of key assemblies that are indicated as the next keystroke input in the active state; and
set the key cover of one or more key assemblies of the plurality of key assemblies that are not indicated as the next keystroke input in the inactive state.

14. The system of claim 9, further comprising a housing operable to support the plurality of key assemblies, wherein the plurality of key assemblies is part of a standalone keyboard, a laptop computer keyboard, a controller device, a gaming controller, a joystick, or a gaming device.

15. A method, comprising:
displacing and providing haptic feedback, by an electromagnet, to a magnet coupled to a key cover within a key assembly based on whether the key assembly is in an active state or an inactive state, the displacing and providing haptic feedback comprising:
  in the active state, raising the key cover to a first position and providing haptic feedback to the key cover based on generating of a magnetic field, and
  in the inactive state, lowering the key cover to a second position and not providing haptic feedback based on stopping the magnetic field, and
wherein whether the key assembly is in the active state or the inactive state is based on input by a user, an application programming interface (API), or an executable application.

16. The method of claim 15, wherein the key assembly is operable to receive a keystroke input via the key cover, and further comprising:
receiving the keystroke input via the key cover while the key cover is at the first position, wherein the first position is at a higher vertical elevation than the second position; and
preventing the keystroke input via the key cover while the key cover is at the second position.

17. The method of claim 15, wherein the key cover and the key base couple together to limit a vertical displacement of the key cover with respect to the key base.

18. The method of claim 15, wherein the key assembly is one of a plurality of key assemblies, and further comprising:
determining a next keystroke input based on one or more previous keystroke inputs;
setting the key cover of one or more key assemblies of the plurality of key assemblies that are indicated as the next keystroke input in the active state; and
setting the key cover of one or more key assemblies of the plurality of key assemblies that are not indicated as the next keystroke input in the inactive state.

19. The method of claim 15, further comprising:
receiving, by the electromagnet, a current from a power source; and
generating, by the electromagnet, the magnetic field based on the current, the magnetic field exerting a force on the magnet to displace the key cover and/or to provide haptic feedback.

20. The method of claim 15, wherein the haptic feedback provided to the key cover includes one or more of an oscillation, a vibration, and a vertical up and down motion.

* * * * *